(12) United States Patent
Murota

(10) Patent No.: US 9,359,527 B2
(45) Date of Patent: Jun. 7, 2016

(54) GAS BARRIER FILM

(71) Applicant: Konica Minolta, Inc., Tokyo (JP)

(72) Inventor: Kazutoshi Murota, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/759,525

(22) PCT Filed: Jan. 9, 2014

(86) PCT No.: PCT/JP2014/050219
§ 371 (c)(1),
(2) Date: Jul. 7, 2015

(87) PCT Pub. No.: WO2014/109356
PCT Pub. Date: Jul. 17, 2014

(65) Prior Publication Data
US 2015/0353775 A1  Dec. 10, 2015

(30) Foreign Application Priority Data

Jan. 11, 2013 (JP) ................................ 2013-003640
Feb. 14, 2013 (JP) ................................ 2013-026892

(51) Int. Cl.
*C09D 183/16* (2006.01)
*H05B 33/04* (2006.01)
(Continued)

(52) U.S. Cl.
CPC ............ *C09D 183/16* (2013.01); *C09D 183/00* (2013.01); *H05B 33/04* (2013.01); *H01L 51/524* (2013.01)

(58) Field of Classification Search
None
See application file for complete search history.

(56) References Cited

U.S. PATENT DOCUMENTS 5,128,286 A * 7/1992 Funayama ............. C08G 77/60
501/96.2
5,543,485 A * 8/1996 Baldus .................. C08G 77/60
501/96.1

(Continued)

FOREIGN PATENT DOCUMENTS

JP   H06299118 A   10/1994
JP   H06306329 A   11/1994
(Continued)

OTHER PUBLICATIONS

International Search Report dated Apr. 15, 2014 for PCT/JP2014/050219 and English translation.
(Continued)

*Primary Examiner* — Robert S Loewe
(74) *Attorney, Agent, or Firm* — Lucas & Mercanti, LLP

(57) ABSTRACT

The purpose of the present invention is to provide a gas barrier film which exhibits excellent storage stability, in particular, excellent storage stability even under harsh conditions (high temperature and high moisture conditions).
The present invention pertains to a gas barrier film which comprises a substrate and a silicon-containing film that has a chemical composition represented by the following Chemical Formula (1) and that satisfies the relationships represented by Mathematical Formula 1 and Mathematical Formula 2:

[Mathematical Formula 1]

$0.001 \leq Y/(X+Y) \leq 0.25$     Mathematical Formula 1

$3.30 \leq 3Y+2X \leq 4.80$     Mathematical Formula 2 in Chemical Formula (1), M represents at least one selected from a group consisting of the elements belonging to Group 2 to Group 14 in the long period type Periodic Table (with the proviso that, silicon and carbon are excluded), x represents an atomic ratio of oxygen relative to silicon, y represents an atomic ratio of nitrogen relative to silicon, and z represents an atomic ratio of M relative to silicon, which is 0.01 to 0.3, and in Mathematical Formula 1 and Mathematical Formula 2, $X=x/(1+(az/4))$, and $Y=y/(1+(az/4))$ (with the proviso that, a is the valency of the element M).

4 Claims, 1 Drawing Sheet

(51) Int. Cl.
*C09D 183/00* (2006.01)
*H01L 51/52* (2006.01)

(56) References Cited

U.S. PATENT DOCUMENTS

2013/0280521 A1* 10/2013 Mori ............... C23C 14/0676
                                                      428/332
2016/0035999 A1*  2/2016 Ii ..................... H01L 51/5253
                                                       257/40

FOREIGN PATENT DOCUMENTS

| JP | H07196986 A | 8/1995 |
|---|---|---|
| JP | H10279362 A | 10/1998 |
| JP | H11105187 A | 4/1999 |
| JP | 2009255040 A | 11/2009 |
| JP | 2012148416 A | 8/2012 |
| WO | 2011074363 A1 | 6/2011 |

OTHER PUBLICATIONS

International Preliminary Report on Patentability dated Jul. 14, 2015 issued from the corresponding International Patent Application No. PCT/JP2014/050219.

English translation of International Preliminary Report on Patentability dated Jul. 14, 2015 issued from the corresponding International Patent Application No. PCT/JP2014/050219.

* cited by examiner

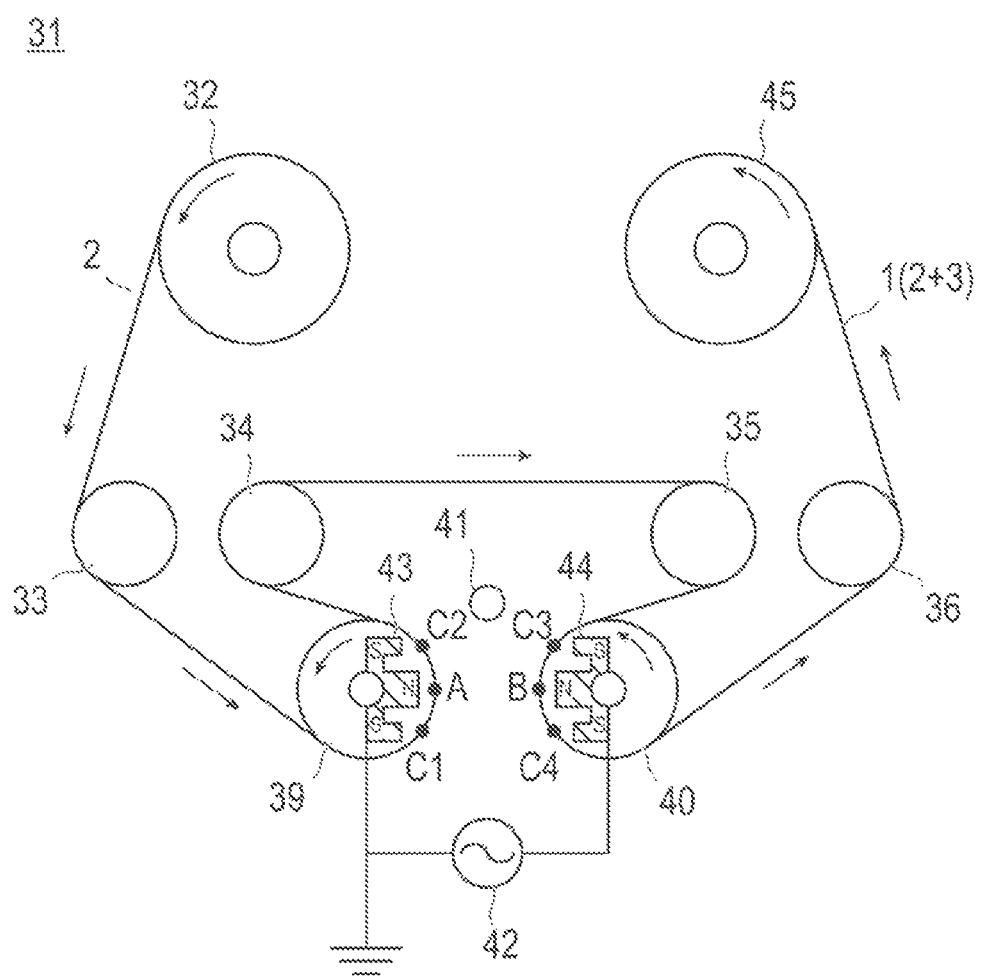

GAS BARRIER FILM

CROSS REFERENCE TO RELATED APPLICATION

This Application is a 371 of PCT/JP2014/050219 filed on Jan. 9, 2014 which, in turn, claimed the priority of Japanese Patent Application No. JP2013-003640 filed on Jan. 11, 2013 and Japanese Patent Application No. JP2013-026892 filed on Feb. 14, 2013, all applications are incorporated herein by reference.

TECHNICAL FIELD

The present invention relates to a gas barrier film. More specifically, it relates to a gas barrier film with excellent storage stability.

BACKGROUND ART

Conventionally, a gas barrier film with a relatively simple structure, which is formed with an inorganic film such as a vapor deposition film of metal or metal oxide on a surface of a resin substrate to prevent permeation of water vapor and gas such as oxygen, has been used in the field of food product, packaging materials, pharmaceutical products, and the like.

Recently, a gas barrier film for preventing permeation of water vapor, oxygen, or the like is also applied for the field of electronic devices such as a liquid crystal display element (LCD), a solar cell (PV), or an organic electroluminescence (EL). In order to impart flexibility and a light and non-brittle property to such electronic devices, a gas barrier film with high gas barrier property is required instead of a glass substrate which is hard and easily breakable.

As a method for obtaining a gas barrier film which can be applied to an electronic device, a method of forming a gas barrier layer on a substrate such as film by performing a plasma CVD method (Chemical Vapor Deposition: chemical vapor phase growing method, chemical vapor deposition method) on a resin substrate, and a method of forming a gas barrier layer by performing a surface treatment (modification treatment) after coating a coating liquid containing polysilazane as a main component on a substrate are known.

For example, in JP 2009-255040 A, for the purpose of achieving both thickening a gas barrier layer for obtaining high gas barrier property and suppressing cracks in a thickened gas barrier layer, a technique of laminating a thin film on a substrate by performing, at least two times, each of a step of forming a polysilazane film according to wet coating of a liquid containing polysilazane and a step of irradiating the formed polysilazane film with vacuum ultraviolet ray is disclosed.

Furthermore, in JP 2012-148416 A, a barrier film having improved scratch resistance which is obtained by adding a transition metal to a silicon-containing film is disclosed.

SUMMARY OF THE INVENTION

Regarding the gas barrier film disclosed in JP 2009-255040 A and JP 2012-148416 A, the gas barrier layer is formed by modification of a polysilazane film according to irradiation of vacuum ultraviolet ray. However, since the gas barrier layer is modified from a surface side which is to be irradiated with vacuum ultraviolet ray, oxygen or moisture is not introduced to the inside of the gas barrier layer and thus a non-reacted (non-modified) region capable of generating ammonia by hydrolysis remains. As this non-reacted (non-modified) region slowly reacts under high temperature and high moisture conditions, side products are generated, and according to diffusion of the side products, the gas barrier layer may suffer from a deformation or disruption. As a result, there is a problem that the gas barrier property slowly deteriorates.

Thus, the present invention which is achieved under the circumstances described above has an object of providing a gas barrier film with excellent storage stability, in particular, excellent storage stability under harsh conditions (high temperature and high moisture conditions).

The inventors of the present invention conducted intensive studies to solve the aforementioned problems. As a result, it was found the problems can be solved by a gas barrier film having a silicon-containing film that has a specific composition. The present invention is completed accordingly.

Specifically, the present invention relates to a gas barrier film having a substrate and a silicon-containing film that has the chemical composition represented by the following Chemical Formula (1) and also satisfies the relationships represented by the following Mathematical Formula 1 and Mathematical Formula 2.

[Chem. 1]

$$SiO_xN_yM_z \quad (1)$$

[Mathematical Formula 1]

$$0.001 \leq Y/(X+Y) \leq 0.25 \quad \text{Mathematical Formula 1}$$

$$3.30 \leq 3Y + 2X \leq 4.80 \quad \text{Mathematical Formula 2}$$

In Chemical Formula (1), M represents at least one selected from a group consisting of the elements belonging to Group 2 to Group 14 in the long period type Periodic Table (with the proviso that, silicon and carbon are excluded), x represents an atomic ratio of oxygen relative to silicon, y represents anatomic ratio of nitrogen relative to silicon, and z represents an atomic ratio of M relative to silicon, which is 0.01 to 0.3, and in Mathematical Formula 1 and Mathematical Formula 2, X=x/(1+(az/4)), and Y=y/(1+(az/4)) (with the proviso that, a is the valency of the element M).

BRIEF DESCRIPTION OF THE DRAWINGS

FIG. 1 is a schematic drawing illustrating an example of a manufacturing apparatus which can be preferably used for forming the barrier layer according to the present invention, in which 1 represents a gas barrier film, 2 represents a substrate, 3 represents a barrier layer, 31 represents a manufacturing apparatus, 32 represents a feeding roller, 33, 34, 35, and 36 represent a conveying roller, 39 and 40 represent a film forming roller, 41 represents a gas supplying pipe, 42 represents a power source for generating plasma, 43 and 44 represent a device for generating magnetic field, and 45 represents a take-up roller.

DETAILED DESCRIPTION

The present invention relates to a gas barrier film having a substrate and a silicon-containing film that has the chemical composition represented by the following Chemical Formula (1) and also satisfies the relationships represented by the following Mathematical Formula 1 and Mathematical Formula 2.

[Chem. 2]

$$SiO_xN_yM_z \qquad (1)$$

[Mathematical Formula 2]

$$0.001 \leq Y/(X+Y) \leq 0.25 \qquad \text{Mathematical Formula 1}$$

$$3.30 \leq 3Y+2X \leq 4.80 \qquad \text{Mathematical Formula 2}$$

In the above Chemical Formula (1), M represents at least one selected from a group consisting of the elements belonging to Group 2 to Group 14 in the long period type Periodic Table (with the proviso that, silicon and carbon are excluded) (hereinbelow, it is also simply referred to as an "addition element"), x represents an atomic ratio of oxygen relative to silicon, y represents anatomic ratio of nitrogen relative to silicon, and z represents an atomic ratio of M relative to silicon, which is 0.01 to 0.3, and in Mathematical Formula 1 and Mathematical Formula 2, X=x/(1+(az/4)), and Y=y/(1+(az/4)) (with the proviso that, a is the valency of the element M).

In order to obtain even higher gas barrier property, it is necessary that light amount of ultraviolet ray for modifying the polysilazane film is increased and plural gas barrier layers are laminated. However, as the film thickness increases according to the progress degree of modification or increase in the number of layers to be laminated, not only the productivity is impaired but also internal shrinkage stress increases within the film to lower the flexibility (plasticity), which is a characteristic of a flexible film with gas barrier property. Accordingly, there is also a problem that durability against physical stress such as bending is deteriorated.

On the other hand, the gas barrier film of the present invention has a substrate and a silicon-containing film which has the chemical composition represented by the above Chemical Formula (1) and also satisfies the relationships of both the above Mathematical Formula 1 and Mathematical Formula 2. The gas barrier film having this constitution of the present invention has excellent storage stability, in particular, excellent storage stability under harsh conditions (high temperature and high moisture conditions) while it maintains a high gas barrier property. The gas barrier film of the present invention also has excellent flexibility (plasticity).

Although the detailed reason remains unclear, it is believed that the reason why the gas barrier film of the present invention has excellent storage stability is as described below.

By having the addition element (element M in Chemical Formula (1)), the film regularity is lowered so that the silicon-containing film according to present invention has lower melting point. Accordingly, the film flexibility is improved or the film is melt by heat or light applied during film forming process. It is believed that, due to this improved film flexibility or melting of the film, defects are restored so that a dense silicon-containing film is yielded and the gas barrier property is enhanced. Furthermore, as the fluidity increases due to improved film flexibility or melting of the film, oxygen is supplied even into the inside of the silicon-containing film to yield a silicon-containing film (barrier film) having the modification progressed into the inside of the film and a silicon-containing film (barrier film) with high oxidation resistance is yielded after the film forming is completed. In this regard, in a barrier film not containing the addition element, absorbance at 250 nm or lower increases as it may be caused by dangling bonds which increase in accordance with irradiation of active energy ray, and also it becomes difficult gradually for the active energy ray to reach the inside of the film, and thus only the film surface is modified. On the other hand, although the detailed reason remains unclear, according to the silicon-containing film of the present invention, it is believed that, as the absorbance at low wavelength side decreases in accordance with irradiation of active energy ray, modification is achieved from the surface to the inside of the silicon-containing film (barrier film) to yield a film which is resistant against an environment of high temperature and high moisture.

Meanwhile, the aforementioned mechanism is just presumption and the present invention is not limited at all to that mechanism.

Hereinbelow, the preferred embodiments of the present invention are described. However, the present invention is not limited to the following embodiments.

Furthermore, as described herein, "X to Y" representing a range means "X or more and Y or less" and "weight" and "mass", "% by weight" and "% by mass", and "parts by weight" and "parts by mass" are treated as synonyms. Furthermore, unless specifically described otherwise, the operations and measurements of physical properties are performed under conditions of room temperature (20 to 25° C.)/relative humidity of 40 to 50%.

<Gas Barrier Film>

The gas barrier film of the present invention has a substrate and a silicon-containing film. The gas barrier film of the present invention may further contain other member. The gas barrier film of the present invention may have other member between a substrate and a silicon-containing film, on top of a silicon-containing film, or on the other surface of a substrate on which no silicon-containing film is formed. Herein, other member is not particularly limited, and a member used for a gas barrier film of a related art can be similarly used. Alternatively, it may be used after suitable modification. Specific examples thereof include a barrier layer containing silicon, carbon, and oxygen, a smooth layer, an anchor coat layer, a bleed out preventing layer, and a functionalized layer such as a protective layer, a moisture absorbing layer, or an antistatic layer.

Meanwhile, in the present invention, the silicon-containing film may be present as a single layer or has a laminated structure in which two or more layers are present.

Furthermore, in the present invention, it is sufficient that the silicon-containing film is formed on at least one surface of a substrate. Thus, the gas barrier film of the present invention includes both modes as follows: a mode in which the silicon-containing film is formed on one surface of a substrate, and a mode in which the silicon-containing film is formed on both surfaces of a substrate.

[Substrate]

Regarding the gas barrier film of the present invention, a plastic film or a plastic sheet is generally used as a substrate, and a film or a sheet consisting of a colorless and transparent resin is preferably used. The plastic film to be used is not particularly limited in terms of a material and thickness as long as it can support the silicon-containing film or the like, and it can be suitably selected depending on the purpose of use or the like. Specific examples of the plastic film include a thermoplastic resin such as a polyester resin, a methacryl resin, a methacrylic acid-maleic acid copolymer, a polystyrene resin, a transparent fluoro resin, polyimide, a fluorinated polyimide resin, a polyamide resin, a polyamide imide resin, a polyether imide resin, a cellulose acylate resin, a polyurethane resin, a polyether ether ketone resin, a polycarbonate resin, an alicyclic polyolefin resin, a polyarylate resin, a polyether sulfone resin, a polysulfone resin, a cycloolefin copolymer, a fluorene ring-modified polycarbonate resin, an alicyclic modified polycarbonate resin, a fluorene ring-modified polyester resin, or an acryloyl compound.

When the gas barrier film according to the present invention is used as a substrate of an electronic device such as an organic EL element, the substrate preferably consists of a material with heat resistance.

Tg or linear expansion coefficient of a substrate can be controlled by additives or the like. Specific examples of a preferred thermoplastic resin which can be used as a substrate include polyethylene terephthalate (PET: 70° C.), polyethylene naphthalate (PEN: 120° C.), polycarbonate (PC: 140° C.), alicyclicpolyolefin (for example, ZEONOR (registered trademark) 1600 manufactured by Zeon Corporation: 160° C.), polyarylate (PAr: 210° C.), polyether sulfone (PES: 220° C.), polysulfone (PSF: 190° C.), cycloolefin copolymer (COC: compound described in JP 2001-150584 A: 162° C.), polyimide (for example, NEOPRIM (registered trademark) manufactured by Mitsubishi Gas Chemical Company, Inc.: 260° C.), polycarbonate modified with fluorene ring (BCF-PC: compound described in JP 2000-227603A: 225° C.), polycarbonate modified with alicycle (IP-PC: compound described in JP 2000-227603 A: 205° C.), and an acryloyl compound (compound described in JP 2002-80616 A: 300° C. or higher) (value in the parenthesis indicates Tg).

Thickness of the substrate which is used for the gas barrier film according to the present invention is not particularly limited as it is suitably selected depending on use. However, it is typically 1 to 800 μm, and preferably 10 to 200 μm. The plastic film may also include a functional layer such as a transparent conductive layer and a primer layer. With regard to the functional layer, those described in paragraphs "0036" to "0038" of JP 2006-289627 A can be suitably employed in addition to those described above.

The substrate preferably has high smoothness. The surface smoothness is preferably 2 nm or less in terms of average surface roughness (Ra). The lower limit is 0.01 nm or more in practical point of view, although it is not particularly limited. If necessary, both surfaces of a substrate or at least a surface formed with a silicon-containing film may be polished to increase the smoothness.

Furthermore, a substrate in which the aforementioned resin or the like is used may be either a non-stretched film or a stretched film.

The substrate to be used in the present invention can be produced by a previously well-known general method. For example, by melting a resin as a material by an extruder, and extruding the molten resin through a ring die or a T-die followed by rapid cooling, an unstretched substrate, which is substantially amorphous and is not oriented, can be produced.

At least a substrate surface for forming the silicon-containing film according to the present invention may be subjected to various known treatments for improving adhesiveness, for example, a corona discharge treatment, a flame treatment, an oxidation treatment, or a plasma treatment, or lamination of a primer layer that is described below. If necessary, those treatments are preferably performed in combination.

[Silicon-Containing Film]

The silicon-containing film according to the present invention is a film (barrier film) having a gas barrier property, which is formed on one surface of a substrate, and it has the chemical composition represented by the above Chemical Formula (1). Furthermore, the silicon-containing film also satisfies both the relationships represented by the above Mathematical Formula 1 and Mathematical Formula 2.

In the above Chemical Formula (1), x represents atomic ratio of oxygen relative to silicon. The x is preferably 1.1 to 3.1, more preferably 1.2 to 2.7, and most preferably 1.3 to 2.6, and it is also preferably within this range in terms of the average value in thickness direction of the silicon-containing film.

In the above Chemical Formula (1), y represents anatomic ratio of nitrogen relative to silicon. The y is preferably 0.001 to 0.51, more preferably 0.01 to 0.39, and most preferably 0.03 to 0.37, and it is also preferably within this range in terms of the average value in thickness direction of the silicon-containing film.

In the above Chemical Formula (1), M is at least one element (addition element) selected from a group consisting of the elements of Group 2 to Group 14 in the long period type Periodic Table excluding carbon and silicon. It is believed that, in the silicon-containing film according to the present invention, which contains this addition element, the film regularity is decreased to lower the melting point and it melts by heat or light during film forming process, and thus defects are restored to yield a more dense film and enhanced gas barrier property. Furthermore, it is believed that, as the fluidity increases due to melting, oxygen is supplied even into the inside of the silicon-containing film to yield a silicon-containing film (barrier film) having the oxidation progressed into the inside of the film and a silicon-containing film (barrier film) with high oxidation resistance is yielded after the film forming is completed. Furthermore, in a (barrier film) not added with the addition element, absorbance at 250 nm or lower increases as it may be caused by dangling bonds which increase in accordance with irradiation of energy ray, and also it becomes difficult gradually for the active energy ray to reach the inside of a silicon-containing film (barrier film), and thus only the surface of a silicon-containing film (barrier film) is modified. On the other hand, although the detailed reason remains unclear, according to the silicon-containing film of the present invention, it is believed that, as the absorbance at low wavelength side decreases in accordance with irradiation of active energy ray, modification is achieved from the surface to the inside of the silicon-containing film (barrier film) to yield a film which is resistant against an environment of high temperature and high moisture. It is also believed that the addition element has a function of a catalyst for the modification of polysilazane by active energy ray irradiation, and according to addition of the addition element, the modification reaction described below progresses more efficiently.

Examples of the addition element which is contained in the silicon-containing film include beryllium (Be), boron (B), magnesium (Mg), aluminum (Al), calcium (Ca), scandium (Sc), titanium (Ti), vanadium (V), chrome (Cr), manganese (Mn), iron (Fe), cobalt (Co), nickel (Ni), copper (Cu), zinc (Zn), gallium (Ga), germanium (Ge), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), and radium (Ra).

Among those elements, boron (B), magnesium (Mg), aluminum (Al), calcium (Ca), titanium (Ti), chrome (Cr), manganese (Mn), iron (Fe), cobalt (Co), copper (Cu), zinc (Zn), gallium (Ga), zirconium (Zr), silver (Ag), and indium (In) are preferable. Boron (B), magnesium (Mg), aluminum (Al), calcium (Ca), iron (Fe), gallium (Ga), and indium (In) are more preferable. Boron (B), aluminum (Al), gallium (Ga), and indium (In) are even more preferable. The element of Group 13 such as boron (B), aluminum (Al), gallium (Ga), and indium (In) has valency of 3, which is lower than the valency of 4 of the valency of silicon, and thus the film flexibility is improved. Due to this improved flexibility, defects are restored and thus the silicon-containing film can become a dense film and can have an improved gas barrier property. Furthermore, by having enhanced flexibility, oxygen is supplied even into the inside of a silicon-containing film so that a silicon-containing film (barrier film) having the oxidation progressed into the inside of the film is obtained, and a silicon-containing film (barrier film) with high oxidation resistance is yielded after the film forming is completed.

Meanwhile, the addition element may be present in a single type or as a mixture of two or more types.

In the above Chemical Formula (1), z represents anatomic ratio of nitrogen relative to silicon and it is 0.01 to 0.3. When z is less than 0.01, effect of the addition is not likely to occur. On the other hand, when z is more than 0.3, the gas barrier property of a silicon-containing film is lowered, and depending on the type of an element, a problem of coloration also occurs. The z is preferably 0.02 to 0.25, and more preferably 0.03 to 0.2.

The silicon-containing film of the present invention also satisfies the relationships represented by Mathematical Formula 1 and Mathematical Formula 2 described above.

With regard to X and Y in Mathematical Formula 1 and Mathematical Formula 2, they represent as sort of the ratio of silicon and oxygen atoms and the ratio of nitrogen atoms relative to a main skeleton when silicon and the addition elements are considered as a main skeleton. Thus, $Y/(X+Y)$ in Mathematical Formula 1 represents the ratio of nitrogen relative to total amount of oxygen and nitrogen, and it has an effect on oxidation stability, transparency, plasticity, or the like of a silicon-containing film.

$Y/(X+Y)$ is in the range of 0.001 to 0.25. When $Y/(X+Y)$ is less than 0.001, dramatic decrease in barrier property is shown after a certain time point under an environment of high temperature and high moisture, possibly due to decrease in the plasticity and deformation of a substrate cannot be dealt with. On the other hand, when it is more than 0.25, a nitrogen part is oxidized under high temperature and high moisture and the barrier property is deteriorated possibly due to presence of a large amount of nitrogen. To exhibit better stability under an environment of high temperature and high moisture, $Y/(X+Y)$ is preferably 0.001 to 0.25, and more preferably 0.02 to 0.20.

Furthermore, $3Y+2X$ in Mathematical Formula 2 is in the range of 3.30 to 4.80. When $3Y+2X$ is less than 3.30, it represents that the oxygen atom and nitrogen atom are insufficient relative to the main skeleton, and it is believed that the silicon with deficient oxygen atom or nitrogen atom is present as an unstable Si radical. Since this Si radical reacts with water vapor, the silicon-containing film is changed over time, thus yielding lower wet heat resistance. On the other hand, when $3Y+2X$ is more than 4.80, the oxygen atom or nitrogen atom is excessive so that a terminal group such as —OH group and —NH$_2$ group is present in a large amount in the main skeleton consisting of silicon and the addition element and the intermolecular network is not continuously present in dense state, yielding lower gas barrier property. $3Y+2X$ is 3.30 to 4.80, and preferably 3.32 to 4.40.

Meanwhile, with regard to "a" representing the valency of the addition element in X and Y, the valency of an addition element in a compound containing the addition element (hereinbelow, also simply referred to as an "addition element compound") which is used in the following method for forming a silicon-containing film is directly employed. When there are plural addition elements, total number weighted based on molar ratio of the addition element is employed.

The silicon-containing film having the aforementioned composition has etching speed of preferably 0.1 to 40 nm/min, and more preferably 1 to 30 nm/min when it is immersed in a 0.125% by weight of aqueous solution of hydrogen fluoride acid at temperature of 25° C. When it is within this range, a silicon-containing film having excellent balance between gas barrier property and plasticity is yielded. Meanwhile, as for the method for measuring etching speed, measurement can be made based on the method described in JP 2009-111029 A, and more specifically, the measurement can be performed based on the method described in the Examples that are described below.

With regard to the chemical composition represented by the above Chemical Formula (1) and the relationships represented by Mathematical Formula 1 and Mathematical Formula 2, control can be made based on type and amount of the silicon compound and addition element compound that are used for forming a silicon-containing film and conditions for modifying a layer which contains the silicon compound and addition element compound. In the following, descriptions are given for a method for forming a silicon-containing film.

[Method for Forming Silicon-Containing Film]

Next, descriptions are given for a preferred method for forming a silicon-containing film according to the present invention. The gas barrier film of the present invention can be formed by forming a silicon-containing film on at least one surface of the aforementioned surface. The method for forming a silicon-containing film according to the present invention on a surface of the aforementioned substrate is not particularly limited, and examples thereof include a method of modifying a layer containing the silicon compound and addition element compound by heating and a method of modifying a layer containing the silicon compound and addition element compound by irradiating the layer with active energy ray.

A layer containing the silicon compound and addition element compound is formed by coating a coating liquid which contains a silicon compound.

(Silicon Compound)

The silicon compound is not particularly limited if it allows preparation of a coating liquid containing a silicon compound. Specific examples thereof include perhydropolysilazane, organopolysilazane, silsesquioxane, tetramethylsilane, trimethylmethoxysilane, dimethyldimethoxysilane, methyltrimethoxysilane, trimethylethoxysilane, dimethyldiethoxysilane, methyltriethoxysilane, tetramethoxysilane, tetramethoxysilane, hexamethyldisiloxane, hexamethyldisilazane, 1,1-dimethyl-1-silacyclobutane, trimethylvinylsilane, methoxydimethylvinylsilane, trimethoxyvinylsilane, ethyltrimethoxysilane, dimethyldivinylsilane, dimethylethoxyethynylsilane, diacetoxydimethylsilane, dimethoxymethyl-3,3,3-trifluoropropylsilane, 3,3,3-trifluoropropyltrimethoxysilane, aryltrimethoxysilane, ethoxydimethylvinylsilane, arylaminotrimethoxysilane, N-methyl-N-trimethylsilylacetamide, 3-aminopropyltrimethoxysilane, methyltrivinylsilane, diacetoxymethylvinylsilane, methyltriacetoxysilane, aryloxydimethylvinylsilane, diethylvinylsilane, butyltrimethoxysilane, 3-aminopropyldimethylethoxysilane, tetravinylsilane, triacetoxyvinylsilane, tetraacetoxysilane, 3-trifluoroacetoxypropyltrimethoxysilane, diaryldimethoxysilane, butyldimethoxyvinylsilane, trimethyl-3-vinylthiopropylsilane, phenyltrimethylsilane, dimethoxymethylphenylsilane, phenyltrimethoxysilane, 3-acryloxypropyldimethoxymethylsilane, 3-acryloxypropyltrimethoxysilane, dimethylisopentyloxyvinylsilane, 2-aryloxyethylthiomethoxytrimethylsilane, 3-glycidoxypropyltrimethoxysilane, 3-arylaminopropyltrimethoxysilane, hexyltrimethoxysilane, heptadecafluorodecyltrimethoxysilane, dimethylethoxyphenylsilane, benzoyloxytrimethylsilane, 3-methacryloxypropyldimethoxymethylsilane, 3-methacryloxypropyltrimethoxysilane, 3-isocyanatepropyltriethoxysilane, dimethylethoxy-3-glycidoxypropylsilane, dibutoxydimethylsilane, 3-butylaminopropyltrimethylsilane, 3-dimethylaminopropyldiethoxymethylsilane, 2-(2-aminoethylthioethyl)triethoxysilane, bis(butylamino)dimethylsilane, divinylmethylphenylsilane, diacetoxymethylphenylsilane, dimethyl-p-tolylvinylsilane, p-styryltrimethoxysilane, diethylmethylphenylsilane, benzyldimethylethoxysilane, diethoxymethylphenylsilane, decylmethyldimethoxysilane, diethoxy-3-glycidoxypropylmethylsilane, octyloxytrimethylsilane, phenyltrivinylsilane, tetraaryloxysilane, dodecyltrimethylsilane, diarylmethylphenylsilane, diphenylmethylvinylsilane, diphenylethoxymethylsilane, diacetoxydiphenylsilane, dibenzyldimethylsilane, diaryldiphenylsilane, octadecyltrimethylsilane, methyloctadecyldimethylsilane, docosylmethyldimethylsilane, 1,3-divinyl-1,1,3,3-tetra methyldisiloxane, 1,3-divinyl-1,1,3,3-tetra methyldisilazane, 1,4-bis(dimethylvinylsilyl)benzene, 1,3-bis(3-acetoxypropyl)tetra methyldisiloxane, 1,3,5-trimethyl-1,3,5-trivinylcyclotrisiloxane, 1,3,5-tris(3,3,3-trifluoropropyl)-1,3,5-trimethylcyclotrisiloxane, octamethylcyclotetra siloxane, 1,3,5,7-tetra ethoxy-1,3,5,7-tetra methylcyclotetrasiloxane, and decamethylcyclopentasiloxane.

Among them, from the viewpoint of having a film forming property, less defects like crack, and less residual organic matters, polysilazane like perhydropolysilazane and organo polysilazane; and polysiloxane like silsesquioxane are preferable. From the viewpoint of having a high gas barrier property and maintaining barrier performance during bending or under high temperature and high moisture conditions, polysilazane is more preferable, and perhydropolysilazane is particularly preferable.

Polysilazane indicates a polymer having a silicon-nitrogen bond and it is a ceramic precursor inorganic polymer such as $SiO_2$, $Si_3N_4$, or an intermediate solid solution of $SiO_xN_y$ containing a bond such as Si—N, Si—H, and N—H.

Specifically, preferred structure of polysilazane is as described below.

[Chem. 3]

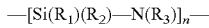    General Formula (I):

In the above General Formula (I), $R_1$, $R_2$ and $R_3$ each independently represent a hydrogen atom, a substituted or unsubstituted alkyl group, aryl group, vinyl group or (trialkoxysilyl)alkyl group. $R_1$, $R_2$ and $R_3$ may be each the same or different from each other. Examples of the alkyl group described herein include a linear, branched, or cyclic alkyl group having 1 to 8 carbon atoms. More specific examples thereof include a methyl group, an ethyl group, a n-propyl group, an isopropyl group, a n-butyl group, an isobutyl group, a sec-butyl group, a tert-butyl group, a n-pentyl group, an isopentyl group, a neopentyl group, a n-hexyl group, a n-heptyl group, a n-octyl group, a 2-ethylhexyl group, a cyclopropyl group, a cyclopentyl group, and a cyclohexyl group. Examples of the aryl group include an aryl group having 6 to 30 carbon atoms. More specific examples thereof include a non-fused hydrocarbon group such as a phenyl group, a biphenyl group, or a terphenyl group; and a fused polycyclic hydrocarbon group such as a pentalenyl group, an indenyl group, a naphthyl group, an azulenyl group, a heptalenyl group, a biphenylenyl group, a fluorenyl group, an acenaphthylenyl group, a pleiadenyl group, an acenaphthenyl group, a phenalenyl group, a phenanthryl group, an anthryl group, a fluoranethenyl group, an acephenanthrylenyl group, an aceanthrylenyl group, a triphenylenyl group, a pyrenyl group, a chrysenyl group, and a naphthacenyl group. Examples of the (trialkoxysilyl)alkyl group include an alkyl group having 1 to 8 carbon atoms in which a silyl group substituted with an alkoxy group having 1 to 8 carbon atoms is included. More specific examples thereof include a 3-(triethoxysilyl)propyl group and a 3-(trimethoxysilyl)propyl group. The substituent group which may be present depending on a case on the aforementioned $R_1$ to $R_3$ is not particularly limited, and examples thereof include an alkyl group, a halogen atom, a hydroxyl group (—OH), a mercapto group (—SH), a cyano group (—CN), a sulfo group (—$SO_3H$), a carboxyl group (—COOH), and a nitro group (—$NO_2$). Meanwhile, the substituent group which may be present depending on a case is not the same as the $R_1$ to $R_3$ to be substituted. For example, when $R_1$ to $R_3$ are an alkyl group, it is not further substituted with an alkyl group. Among them, $R_1$, $R_2$ and $R_3$ are preferably a hydrogen atom, a methyl group, an ethyl group, a propyl group, an isopropyl group, a butyl group, an isobutyl group, a tert-butyl group, a phenyl group, a vinyl group, a 3-(triethoxysilyl)propyl group, or a 3-(trimethoxysilylpropyl) group.

It is also preferable to set the n in General Formula (I), which is an integer, is determined such that the polysilazane having the structure represented by the above General Formula (I) has a number average molecular weight of 150 to 150,000 g/mol.

One preferred mode of the compound having the structure represented by the above General Formula (I) is perhydropolysilazane in which all of $R_1$, $R_2$ and $R_3$ are a hydrogen atom.

Alternatively, polysilazane has a structure represented by the following General Formula (II).

[Chem. 4]

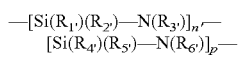    General Formula (II):

In the above General Formula (II), $R_{1'}$, $R_{2'}$, $R_{3'}$, $R_{4'}$, $R_{5'}$ and $R_{6'}$ each independently represent a hydrogen atom, a substituted or unsubstituted alkyl group, aryl group, vinyl group or (trialkoxysilyl)alkyl group. $R_{1'}$, $R_{2'}$, $R_{3'}$, $R_{4'}$, $R_{5'}$ and $R_{6'}$ may be each the same or different from each other. Since the substituted or unsubstituted alkyl group, aryl group, vinyl group or (trialkoxysilyl)alkyl group are as defined in the above for General Formula (I), no further descriptions are given therefor.

It is also preferable to set the n' and p in General Formula (II), which are an integer, are determined such that the polysilazane having the structure represented by the above General Formula (II) has a number average molecular weight of 150 to 150,000 g/mol. Meanwhile, n' and p may be the same or different from each other.

Among the polysilazanes of General Formula (II), a compound in which $R_{1'}$, $R_{3'}$ and $R_{6'}$ each represent a hydrogen atom and $R_{2'}$, $R_{4'}$ and $R_{5'}$ each represent a methyl group; a compound in which $R_{1'}$, $R_{3'}$ and $R_{6'}$ each represent a hydrogen atom, $R_{2'}$, $R_{4'}$ each represent a methyl group, and $R_{5'}$ represents a vinyl group; a compound in which $R_{1'}$, $R_{3'}$, $R_{4'}$ and $R_{6'}$ each represent a hydrogen atom and $R_{2'}$ and $R_{5'}$ each represent a methyl group are preferable.

Alternatively, polysilazane has a structure represented by the following General Formula (III).

[Chem. 5]

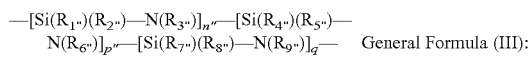
General Formula (III):

In the above General Formula (III), $R_{1'''}$, $R_{2'''}$, $R_{3'''}$, $R_{4'''}$, $R_{5'''}$, $R_{6'''}$, $R_{7'''}$, $R_{8'''}$ and $R_{9'''}$ each independently represent a hydrogen atom, a substituted or unsubstituted alkyl group, aryl group, vinyl group or (trialkoxysilyl)alkyl group. $R_{1'''}$, $R_{2'''}$, $R_{3'''}$, $R_{4'''}$, $R_{5'''}$, $R_{6'''}$, $R_{7'''}$, $R_{8'''}$ and $R_{9'''}$ may be each the same or different from each other. Since the substituted or unsubstituted alkyl group, aryl group, vinyl group or (trialkoxysilyl) alkyl group are as defined in the above for General Formula (I), no further descriptions are given therefor.

It is also preferable to set the n", p", and q in General Formula (III), which are an integer, are determined such that the polysilazane having the structure represented by the above General Formula (III) has a number average molecular weight of 150 to 150,000 g/mol. Meanwhile, n", p", and q may be the same or different from each other.

Among the polysilazanes of General Formula (III), a compound in which $R_{1'''}$, $R_{3'''}$ and $R_{6'''}$ each represent a hydrogen atom, $R_{2'''}$, $R_{4'''}$, $R_{5'''}$ and $R_{8'''}$ each represent a methyl group, $R_{9'''}$ represents a (triethoxysilyl)propyl group and $R_{7'''}$ represents an alkyl group or a hydrogen atom is preferable.

Meanwhile, when organo polysilazane in which a part of the hydrogen atoms bonded to Si is substituted with an alkyl group or the like, adhesiveness to a substrate as a base is improved by having an alkyl group such as a methyl group, and a ceramic film which is highly brittle due to hardness can be provided with toughness by polysilazane. Thus, there is an advantage that an occurrence of cracks is suppressed even when (average) film thickness is increased. As such, perhydropolysilazane and organo polysilazane can be suitably selected depending on use, and they can also be used as a mixture.

The perhydropolysilazane is believed to have a structure in which a linear chain structure and a ring structure having 6- and 8-membered ring as a main ring are present. The molecular weight is about 600 to 2,000 (polystyrene conversion value) in terms of a number average molecular weight (Mn). It is a material of liquid or solid, and the state differs depending on the molecular weight.

Polysilazane is commercially available in a solution state in which it is dissolved in an organic solvent. The commercially available product itself can be used as a coating liquid for forming the polysilazane layer. Examples of the commercially available polysilazane solution include AQUAMICA (registered trademark) NN120-10, NN120-20, NAX120-20, NN110, NN310, NN320, NL110A, NL120A, NL120-20, NL150A, NP110, NP140, SP140 and the like, that are manufactured by AZ Electronic Materials.

Another examples of polysilazane that can be used in the present invention include, but are not limited to, polysilazane which is ceramized at low temperatures such as silicon alkoxide added polysilazane, being produced by reacting silicon alkoxide with polysilazane (JP H05-238827 A); glycidol added polysilazane, being produced by reacting glycidol (JP H06-122852 A); alcohol added polysilazane, being produced by reacting alcohol (JP H06-240208 A); metal carboxylic acid salt added polysilazane, being produced by reacting metal carboxylate salt (JP H06-299118 A); acetyl acetonate complex added polysilazane, being produced by reacting acetyl acetonate complex containing a metal (JP H06-306329 A); and metal fine particle added polysilazane, being produced by adding metal fine particles (JP H07-196986 A).

(Addition Element Compound)

The type of the addition element compound is not particularly limited. However, from the viewpoint of forming more efficiently the silicon-containing film of the present invention, alkoxide of the addition element is preferable. As described herein, "alkoxide of the addition element" indicates a compound having at least one alkoxy group which binds to the addition element. Meanwhile, the addition element compound can be used either singly or in combination of two or more types. Furthermore, a commercially available product or a synthesized product can be used as the addition element compound.

Examples of an alkoxide of the addition element include beryllium acetylacetonate, trimethyl borate, triethyl borate, tri n-propyl borate, triisopropyl borate, tri n-butyl borate, tri tert-butyl borate, magnesium ethoxide, magnesium ethoxyethoxide, magnesium methoxyethoxide, magnesium acetylacetonate, aluminum trimethoxide, aluminum triethoxide, aluminum tri n-propoxide, aluminum triisopropoxide, aluminum tri n-butoxide, aluminum tri sec-butoxide, aluminum tri tert-butoxide, aluminum acetylacetonate, acetoalkoxy aluminum diisopropylate, aluminum ethyl acetoacetate.diisopropylate, aluminum ethyl acetoacetate di n-butyrate, aluminum diethylacetoacetate mono n-butyrate, aluminum diisopropylate mono sec-butyrate, aluminum tris acetylacetonate, aluminum tris ethyl acetoacetate, bis(ethylacetoacetate) (2,4-pentanedionato)aluminum, aluminum alkylacetoacetate diisopropylate, aluminum oxide isopropoxide trimer, aluminum oxide octylate trimer, calcium methoxide, calcium ethoxide, calcium isopropoxide, calcium acetylacetonate, scandium acetylacetonate, titanium tetramethoxide, titanium tetraethoxide, titanium tetranormalpropoxide, titanium tetraisopropoxide, titanium tetranormalbutoxide, titanium tetraisobutoxide, titanium diisopropoxydinormalbutoxide, titanium ditert-butoxydiisopropoxide, titanium tetratert-butoxide, titanium tetraisooctyloxide, titanium tetrastearylalkoxide, vanadium triisobutoxide, tris(2,4-pentanedionato)chrome, chrome n-propoxide, chrome isopropoxide, manganese methoxide, tris(2,4-pentanedionato) manganese, iron methoxide, iron ethoxide, iron n-propoxide, iron isopropoxide, tris(2,4-pentanedionato)iron, cobalt isopropoxide, tris(2,4-pentanedionato)cobalt, nickel acetylacetonate, copper methoxide, copper ethoxide, copper isopropoxide, copper acetylacetonate, zinc ethoxide, zinc ethoxyethoxide, zinc methoxyethoxide, gallium methoxide, gallium ethoxide, gallium isopropoxide, gallium acetylacetonate, germanium methoxide, germanium ethoxide, germanium isopropoxide, germanium n-butoxide, germanium tert-butoxide, ethyltriethoxy germanium, strontium isopropoxide, yttrium n-propoxide, yttrium isopropoxide, yttrium acetylacetonate, zirconium ethoxide, zirconium n-propoxide, zirconium isopropoxide, zirconium butoxide, zirconium tert-butoxide, tetrakis(2,4-pentanedionato)zirconium, niobium ethoxide, niobium n-butoxide, niobium tert-butoxide, molybdenum ethoxide, molybdenum acetylacetonate, palladium acetylacetonate, silver acetylacetonate, cadmium acetylacetonate, tris(2,4-pentanedionato)indium, indium isopropoxide, indiumisopropoxide, indiumn-butoxide, indium methoxyethoxide, tin n-butoxide, tin tert-butoxide, tin acetylacetonate, barium diisopropoxide, barium tert-butoxide, barium acetylacetonate, lanthanum isopropoxide, lanthanum methoxyethoxide, lanthanum acetylacetonate, cerium n-butoxide, cerium tert-butoxide, cerium acetylacetonate, praseodymium methoxyethoxide, praseodymium acetylacetonate, neodymium methoxyethoxide, neodymium acetylacetonate, neodymium methoxyethoxide, samarium isopropoxide, samarium acetylacetonate, europium acetylacetonate, gadolinium acetylacetonate, terbium acetylacetonate, holmium acetylacetonate, ytterbium acetylacetonate, lutetium acetylacetonate, hafnium ethoxide, hafnium n-butoxide, hafnium tert-butoxide, hafnium acetylacetonate, tantalum methoxide, tantalum ethoxide, tantalum n-butoxide, tantalum butoxide, tantalum tetramethoxide acetylacetonate, tungsten ethoxide, iridium acetylacetonate, iridium dicarbonylacetylacetonate, thallium ethoxide, thallium acetylacetonate, and lead acetylacetonate. Among those alkoxides of the addition element, triisopropyl borate, magnesium ethoxide, aluminum tri sec-butoxide, aluminum ethylacetoacetate.diisopropylate, calcium isopropoxide, titanium tetraisopropoxide, gallium isopropoxide, aluminum diisopropylate mono sec-butyrate, aluminum ethylacetoacetate di n-butyrate, and aluminum diethylacetoacetate mono n-butyrate are preferable.

The method of forming the silicon-containing film according to the present invention is not particularly limited, and a known method can be used. A method including coating a coating liquid for forming a silicon-containing film which contains a silicon compound, a compound containing an addition element, and if necessary, a catalyst in an organic solvent by a known wet coating method, removing the solvent by evaporation, and performing a modification treatment is preferable.

(Coating Liquid for Forming Silicon-Containing Film)

A solvent for preparing a coating liquid for forming a silicon-containing film is not particularly limited, as long as it can dissolve a silicon compound and the addition element compound. However, an organic solvent not including water and a reactive group (for example, a hydroxyl group or an amine group) which easily react with a silicon compound and is inert to the silicon compound is preferable. Aprotic organic solvent is more preferable. Specific examples of the solvent include an aprotic solvent; for example, hydrocarbon solvent such as an aliphatic hydrocarbon, an alicyclic hydrocarbon or an aromatic hydrocarbon such as pentane, hexane, cyclohexane, toluene, xylene, solvesso, or terpene; a halogenated hydrocarbons such as methylene chloride, or trichloroethane; esters such as ethyl acetate and butyl acetate; ketones such as acetone and methyl ethyl ketone; ethers such as aliphatic ether and alicyclic ether such as dibutyl ether, dioxane, or tetrahydrofuran, for example, tetrahydrofuran, dibutyl ether, mono- and polyalkylene glycol dialkyl ether (diglymes). The solvent is selected depending on the purpose such as ability of dissolving a silicon compound and an addition element compound or evaporation rate of a solvent, or the like. It may be used either singly or as a mixture of two or more types.

Although the silicon compound concentration in the coating liquid for forming the silicon-containing film is not particularly limited and varies in accordance with the film thickness of the layer or the pot life of the coating liquid, it is preferably 0.1 to 30% by weight, more preferably 0.5 to 20% by weight, and even more preferably 1 to 15% by weight.

Furthermore, although concentration of the addition element compound in the coating liquid for forming the silicon-containing film is not particularly limited and varies in accordance with the film thickness of the layer or the pot life of the coating liquid, it is preferably 0.01 to 20% by weight, more preferably 0.1 to 10% by weight, and even more preferably 0.2 to 5% by weight.

Furthermore, the weight ratio between the silicon compound and the addition element compound in a coating liquid for forming the silicon-containing film is, in terms of the silicon compound: the addition element compound, preferably 1:0.05 to 1:3.9, more preferably 1:0.12 to 1:3.0, and even more preferably 1:0.3 to 1:2.0. When it is within this range, the silicon-containing film according to the present invention can be more efficiently obtained.

In order to promote the modification, a catalyst is preferably contained in a coating liquid for forming the silicon-containing film. As a catalyst which can be applied for the present invention, a basic catalyst is preferable. In particular, an amine catalyst such as N,N-dimethylethanolamine, N,N-diethylethanolamine, triethanolamine, triethylamine, 3-morpholino propylamine, N,N,N',N'-tetra methyl-1,3-diaminopropane, or N,N,N',N'-tetra methyl-1,6-diaminohexane, a metal catalyst including a Pt compound such as Pt acetyl acetonate, a Pd compound such as Pd propionate, and a Rh compound such as Rh acetylacetonate, and an N-heterocyclic compound can be exemplified. Among them, it is preferable to use an amine catalyst. While taking the silicon compound as a reference, a concentration of the catalyst to be added is usually within a range of 0.1 to 10% by weight, preferably, within a range of 0.5 to 7% by weight. By having an addition amount of the catalyst within the range, having an excessive forming amount of silanol, decrease in film density, and an increase in film defects that are caused by a rapid progress of the reaction can be avoided.

If necessary, the following additives can be used in a coating liquid for forming the silicon-containing film. Examples include cellulose ethers, cellulose esters; for example, ethylcellulose, nitrocellulose, cellulose acetate, and cellulose acetobutylate, natural resins; for example, rubbers and rosin resins, synthetic resins; for example, polymerized resins, condensed resins; for example, aminoplast, in particular, urea resin, melamine formaldehyde resin, alkyd resin, acrylic resin, polyester or modified polyester, epoxide, polyisocyanate, or blocked polyisocyanate, and polysiloxane.

(Method for Coating a Coating Liquid for Forming Silicon-Containing Film)

As for the method of applying a coating liquid for forming a silicon-containing film, any suitable known wet coating method may be used. Specific examples thereof include a spin coating method, a roll coating method, a flow coating method, an inkjet method, a spray coating method, a printing method, a dip coating method, a cast film forming method, a bar coating method, and Gravure method.

The coating thickness can be suitably set depending on the purpose. For example, the coating thickness is preferably 0.01 to 1 μm, more preferably 0.02 to 0.6 μm, and even more preferably 0.04 to 0.4 μm in terms of thickness after drying. When the film thickness is equal to or more than 0.01 μm, a sufficient barrier property can be obtained. On the other hand, when it is 1 μm or less, a stable coating property can be obtained during layer forming and also high light transmission can be achieved.

It is desirable to dry a coating film after coating a coating liquid. According to drying of a coating film, an organic solvent contained in the coating film can be removed. At that time, the organic solvent contained in the coating film can be removed entirely or some of the solvent may remain. Even for a case in which some of the solvent remain, a preferred silicon-containing film can be obtained. Meanwhile, the remaining solvent can be removed later.

Drying temperature of a coating film varies depending on a substrate for application. However, it is preferably 50 to 200° C. For example, in a case where a polyethylene terephthalate substrate with a glass transition temperature (Tg) of 70° C. is used as a substrate, the drying temperature is preferably set at 150° C. or lower considering deformation of a substrate caused by heat or the like. The temperature can be set by using a hot plate, an oven, a furnace or the like. The drying time is preferably set to short time and it can be set to 30 minutes or shorter when the drying temperature is 150° C. Furthermore, the drying atmosphere can be any one condition including air atmosphere, nitrogen atmosphere, argon atmosphere, vacuum atmosphere, and reduced pressure atmosphere with controlled oxygen concentration.

(Modification Treatment)

In the present invention, the modification treatment indicates a conversion reaction of a silicon compound and the addition element compound to the chemical composition represented by the above Chemical Formula (1). Further, it indicates a treatment of forming an inorganic thin film to the level at which the gas barrier film of the present invention as a whole can contribute to exhibiting the gas barrier property (water vapor transmission rate is $1 \times 10^{-3}$ g/m$^2$·day or less).

The modification treatment is performed by a known method. Specific examples thereof include a heating treatment, a plasma treatment, and an active energy ray irradiation treatment. Among them, from the viewpoint that the modification can be achieved at low temperatures and freedom level for choosing substrate is high, an active energy ray irradiation treatment is preferable.

(Heating Treatment)

Examples of the heating treatment include a method of heating a coating film with heat conduction by bringing a substrate into contact with a heat generator such as a heat block, a method of heating the atmosphere in which a coating film is placed by an external heater with resistance wire or the like, a method using light in an infrared region such as an IR heater, and the like. However, the heating treatment is not particularly limited to these methods. Further, a method capable of maintaining smoothness of a coating film may be appropriately selected when the heating treatment is carried out.

The temperature for heating a coating film is preferably in the range of 40 to 250° C., and more preferably in the range of 60 to 150° C. The heating time is preferably in a range of 10 seconds to 100 hours, and more preferably in a range of 30 seconds to 5 minutes.

(Plasma Treatment)

In the present invention, a known method can be used for a plasma treatment which can be used as a modification treatment. However, an atmospheric pressure plasma treatment can be mentioned as a preferred example. The atmospheric pressure plasma CVD method by which a plasma CVD treatment is performed near atmospheric pressure has not only high productivity by not requiring reduced pressure but also has high film forming rate due to high plasma density compared to a plasma CVD method under vacuum. Furthermore, compared to conditions for general CVD method, the average free step for gas is very short at high pressure conditions such as atmospheric condition, and thus a very even film is obtained.

In the case of an atmospheric pressure plasma treatment, nitrogen gas or an atom in the Group 18 of the long period type Periodic Table, specifically helium, neon, argon, krypton, xenon, radon or the like is used as discharge gas. Among them, nitrogen, helium and argon are preferably used. In particular, nitrogen is preferred in that the cost is low.

(Active Energy Ray Irradiation Treatment)

As for the active energy ray, infrared ray, visible ray, ultraviolet ray, X ray, electron beam, α ray, β ray, γ ray, or the like can be used. However, electron beam and ultraviolet ray are preferable, and ultraviolet ray is more preferable. Ozone or active oxygen atom produced by ultraviolet ray (same meaning as ultraviolet light) has a high oxidizing ability, and thus it allows forming of a silicon-containing film which has high density and insulating property at low temperatures.

For the ultraviolet ray irradiation treatment, any commercially available ultraviolet ray generator can be used.

Meanwhile, the ultraviolet ray described herein generally means an electromagnetic wave having a wavelength of 10 to 400 nm. For the ultraviolet ray irradiation treatment other than the vacuum ultraviolet ray (10 to 200 nm) treatment, ultraviolet ray of 210 to 375 nm is preferably used.

Examples of the unit for generating an ultraviolet ray include, but are not particularly limited to, a metal halide lamp, a high pressure mercury lamp, a low-pressure mercury lamp, a xenon arc lamp, a carbon arc lamp, an excimer lamp (single wavelength of 172 nm, 222 nm or 308 nm; manufactured by, for example, USHIO Inc. or M. D. Com. Inc.) and an ultraviolet ray laser. When the silicon-containing film is irradiated with an ultraviolet ray generated, from the viewpoint of improving efficiency and achieving uniform irradiation, it is desirable to apply the ultraviolet ray from the generation source to the silicon-containing film after reflecting the ultraviolet ray by a reflection plate.

The required time for ultraviolet ray irradiation depends on the composition and concentration of the substrate used and the silicon-containing film, but is generally 0.1 second to 10 minutes, preferably 0.5 second to 3 minutes.

(Vacuum Ultraviolet Ray Irradiation Treatment: Excimer Irradiation Treatment)

In the present invention, the most preferred modification treatment method is a treatment by vacuum ultraviolet ray irradiation (excimer irradiation treatment). The treatment by vacuum ultraviolet ray irradiation is a method of forming a silicon oxide film at a relatively low temperature (about 200° C. or lower) by allowing an oxidization reaction by active oxygen or ozone to proceed while directly cutting the bond of atoms by the action of only photons, which is called a light quantum process, using light energy of 100 to 200 nm, which is greater than an interatomic bonding force within a polysilazane compound, preferably using energy of light having a wavelength of 100 to 180 nm.

A irradiation source of the present invention can be any one which emits light with wavelength of from 100 to 180 nm, and it is preferably an excimer radiator (for example, a Xe excimer lamp) having the maximum irradiation at about 172 nm, a low-pressure mercury vapor lamp having an emission line at about 185 nm, medium-pressure and high pressure mercury vapor lamps having a wavelength component of 230 nm or less, and an excimer lamp having the maximum irradiation at about 222 nm.

Among them, a Xe excimer lamp is excellent in efficiency of light emission since an ultraviolet ray having a short wavelength of 172 nm is irradiated at a single wavelength. Since this light has a high oxygen absorption coefficient, the light enables a high concentration of a radical oxygen atomic species or ozone to be generated with a very small amount of oxygen.

Further, the energy of light having a short wavelength of 172 nm is known to have a high capacity which dissociates the bond of organic material. Modification of a polysilazane layer can be realized in a short time by the high energy of this active oxygen or ozone and ultraviolet ray irradiation.

Oxygen is required for the reaction by ultraviolet ray irradiation. However, since the vacuum ultraviolet ray has absorption by oxygen, efficiency may be easily lowered during vacuum ultraviolet ray irradiation process. Therefore, vacuum ultraviolet ray irradiation is preferably carried out in a state in which oxygen concentration and water vapor concentration are as low as possible. The oxygen concentration during the vacuum ultraviolet ray irradiation is preferably 10 to 210,000 ppm by volume, more preferably 50 to 10,000 ppm by volume, and most preferably 100 to 5,000 ppm by volume. Further, the water vapor concentration during the conversion process is preferably in a range of 1,000 to 4,000 ppm by volume.

A gas satisfying the irradiation atmosphere used for vacuum ultraviolet ray irradiation is preferably dry inert gas, and in particular, is preferably dry nitrogen gas from the viewpoint of cost. The adjustment of oxygen concentration can be achieved by changing flow amount ratio after measuring flow amount of oxygen gas and inert gas that are introduced to an irradiation cabin.

An irradiation energy amount of the vacuum ultraviolet ray on the surface of the coating film is preferably 200 to 10,000 mJ/cm$^2$, and more preferably 500 to 5,000 mJ/cm$^2$. When it is lower than 200 mJ/cm$^2$, the modification may become insufficient. On the other hand, when it is higher than 10,000 mJ/cm$^2$, an occurrence of cracks caused by excessive modification or substrate deformation caused by heat may occur.

Furthermore, the vacuum ultraviolet ray used for the modification may be generated by plasma which has been formed with gas containing at least one of CO, $CO_2$ and $CH_4$. Furthermore, regarding the gas containing at least one of CO, $CO_2$ and $CH_4$ (hereinbelow, also referred to as carbon-containing gas), although the carbon-containing gas may be used singly, it is preferably used as mixture gas in which rare gas or $H_2$ is contained as a main gas and a small amount of carbon-containing gas is added. Examples of a method for generation plasma include capacity coupled plasma.

Film composition of a silicon-containing film can be measured by measuring the atomic composition ratio by using a XPS surface analyzer. It can be also measured by measuring atomic ratio on a cross-section of a silicon-containing film by using a XPS surface analyzer.

Film density of a silicon-containing film can be suitably set depending on the purpose. For example, film density of a silicon-containing film is preferably in a range of from 1.5 to 2.6 g/cm$^3$. When it is within this range, density of the film increases so that deterioration of a gas barrier property or deterioration of a film under high temperature and high moisture conditions can be prevented.

[Barrier Layer]

The gas barrier film of the present invention contains, separately from the silicon-containing film, silicon, oxygen, and carbon and it may further contain a barrier layer which satisfies the following requirements (i) to (iii).

(i) With regard to a silicon distribution curve showing the relationship between the distance (L) from a surface of the barrier layer in film thickness direction of the barrier layer and ratio of the amount of silicon atoms (silicon atomic ratio) relative to total amount of silicon atoms, oxygen atoms and carbon atoms, an oxygen distribution curve showing the relationship between the L and ratio of the amount of oxygen atoms (oxygen atomic ratio) relative to total amount of silicon atoms, oxygen atoms and carbon atoms, and a carbon distribution curve showing the relationship between the L and ratio of the amount of carbon atoms (carbon atomic ratio) relative to total amount of silicon atoms, oxygen atoms and carbon atoms, abundance is high in order of (oxygen atomic ratio), (silicon atomic ratio), (carbon atomic ratio) (atomic ratio of O>Si>C) within at least 90% film thickness region of the barrier layer (upper limit: 100%);

(ii) the carbon distribution curve has at least two extreme values; and (iii) the absolute value of a difference between the maximum value and the minimum value of the carbon atomic ratio in the carbon distribution curve (hereinbelow, also simply referred to as "difference of $C_{max}$–$C_{min}$") is 3 at % or more.

In the barrier layer, it is preferable that (i) with regard to a silicon distribution curve showing the relationship between the distance (L) from a surface of the barrier layer in film thickness direction of the barrier layer and ratio of the amount of silicon atoms (silicon atomic ratio) relative to total amount of silicon atoms, oxygen atoms and carbon atoms, an oxygen distribution curve showing the relationship between the L and ratio of the amount of oxygen atoms (oxygen atomic ratio) relative to total amount of silicon atoms, oxygen atoms and carbon atoms, and a carbon distribution curve showing the relationship between the L and ratio of the amount of carbon atoms (carbon atomic ratio) relative to total amount of silicon atoms, oxygen atoms and carbon atoms, abundance be high in the order of (oxygen atomic ratio), (silicon atomic ratio), (carbon atomic ratio) (atomic ratio of O>Si>C) within at least 90% film thickness region of the barrier layer (upper limit: 100%). When the requirement (i) is not satisfied, the gas barrier film to be obtained might have an insufficient gas barrier property or bending property. Herein, the relationship among (oxygen atomic ratio), (silicon atomic ratio), (carbon atomic ratio) in the carbon distribution curve is more preferably satisfied within at least 90% film thickness region of the barrier layer (upper limit: 1000), and more preferably satisfied within at least 93% film thickness region of the barrier layer (upper limit: 100%). Herein, the expression "at least 90% film thickness region of the barrier layer" does not require continuity in the barrier layer, and it is sufficient to satisfy the relationship just within a region of at least 90%.

Furthermore, in the barrier layer, it is preferable that (ii) the carbon distribution curve have at least two extreme values. The barrier layer more preferably has at least three extreme values, and even more preferably at least four extreme values in the carbon distribution curve. However, it may have five or more extreme values. When the extreme value is 1 or less in the carbon distribution curve, the gas barrier property may become insufficient when the gas barrier film is bent. Meanwhile, the upper limit of the extreme value of the carbon distribution curve is, although not particularly limited, preferably 30 or less, and more preferably 25 or less, for example. However, as the number of extreme values is affected also by the film thickness of a barrier layer, it cannot be defined uniformly.

Herein, when there are at least three extreme values, the absolute value of a difference (hereinbelow, also simply referred to as "distance between extreme values") between one extreme value in the carbon distribution curve and the distance (L) from a surface of the barrier layer in film thickness direction of the barrier layer, which is at the extreme value adjacent to the aforementioned extreme value, is preferably 200 nm or less, more preferably 100 nm or less, and particularly preferably 75 nm or less in any cases. With such distance between extreme values, a region having high carbon atomic ratio (highest value) is present at suitable period in the barrier layer, and thus suitable bending property is given to the barrier layer and an occurrence of cracks can be effectively suppressed and prevented at the time of bending a gas barrier film. Meanwhile, the term "extreme value" described herein means the highest value or the lowest value of the atomic ratio of an atom relative to the distance (L) from a surface of the barrier layer in film thickness direction of the barrier layer. Furthermore, the "highest value" described herein means a point at which the atomic ratio value of an atom (oxygen, silicon, or carbon) changes from increase to decrease when the distance from a surface of the barrier layer is changed, and the atomic ratio value of an atom at a position which results from a change of the distance from a surface of the barrier layer in film thickness direction of the barrier layer within a range of 4 to 20 nm from the aforementioned point is decreased by 3 at % or more relative to the atomic ratio value of the element of the aforementioned point. In other words, it is sufficient that, when a change is made within a region of from 4 to 20 nm, the atomic ratio value of an element is decreased by 3 at % or more in any range. Similarly, the "lowest value" described herein means a point at which the atomic ratio value of an element (oxygen, silicon, or carbon) changes from decrease to increase when the distance from a surface of the barrier layer is changed, and the atomic ratio value of an element at a position which results from a change of the distance from a surface of the barrier layer in film thickness direction of the barrier layer within a range of 4 to 20 nm from the aforementioned point is increased by 3 at % or more relative to the atomic ratio value of the element of the aforementioned point. In other words, it is sufficient that, when a change is made within a range of from 4 to 20 nm, the atomic ratio value of an element is increased by 3 at % in any range. Herein, for a case of having at least three extreme values, the lower limit of the distance between extreme values is not particularly limited as the effect of suppressing/preventing an occurrence of cracks during bending of a gas barrier film increases as the distance between extreme values decreases. However, considering the bending property of the barrier layer, effect of suppressing/preventing an occurrence of cracks, thermal expansion or the like, it is preferably 10 nm or more, and more preferably 30 nm or more.

Furthermore, in the barrier layer, it is preferable that (iii) the absolute value of a difference between the maximum value and the minimum value of the carbon atomic ratio in the carbon distribution curve (hereinbelow, also simply referred to as "difference of $C_{max}$–$C_{min}$") be 3 at % or more. When the absolute value is less than 3 at %, the gas barrier property may become insufficient when the gas barrier film to be obtained is bent. The difference of $C_{max}$–$C_{min}$ is preferably 5 at % or more, more preferably 7 at % or more, and particularly preferably 10 at % or more. By having the aforementioned difference of $C_{max}$–$C_{min}$, the gas barrier property can be further improved. Meanwhile, as described herein, the "maximum value" means the atomic ratio of each atom representing the maximum in distribution curve of each element, indicating the largest value among the highest values. Similarly, the "minimum value" described herein means the atomic ratio of each atom representing the lowest in distribution curve of each element, indicating the smallest value among the lowest values. Herein, the upper limit of the difference of $C_{max}$–$C_{min}$ is, although not particularly limited, preferably 50 at % or less and more preferably 40 at % or less considering the effect of suppressing/preventing an occurrence of cracks during bending of a gas barrier film.

In the present invention, the oxygen distribution curve of the barrier layer preferably has at least one extreme value, more preferably at least two extreme values, and even more preferably at least three extreme values. When the oxygen distribution curve has at least one extreme value, the obtained gas barrier film after bending shows more improved gas barrier property. Meanwhile, the upper limit of the extreme value of the oxygen distribution curve is, although not particularly limited, preferably 20 or less, and more preferably 10 or less. The number of extreme values in oxygen distribution curve cannot be uniformly defined because it is partially affected by film thickness of a barrier layer. Furthermore, when there are at least three extreme values, the absolute value of a difference in the distance from a surface of the barrier layer between one extreme value and an extreme value adjacent to the aforementioned extreme value in the oxygen distribution curve in film thickness direction of the barrier layer, is preferably 200 nm or less, and more preferably 100 nm or less. With such distance between extreme values, an occurrence of cracks can be effectively suppressed and prevented at the time of bending a gas barrier film. Herein, for a case of having at least three extreme values, the lower limit of the distance between extreme values is, although not particularly limited, preferably 10 nm or more, and more preferably 30 nm or more considering the effect of suppressing/preventing an occurrence of cracks at the time of bending a gas barrier film, thermal expansion or the like.

Furthermore, in the barrier layer of the present invention, the absolute value of a difference between the maximum value and the minimum value of the oxygen atomic ratio in the oxygen distribution curve (hereinbelow, also simply referred to as "difference of $O_{max}$–$O_{min}$") is preferably 3 at % or more, more preferably 5 at % or more, even more preferably 6 at % or more, and particularly preferably 7 at % or more. When the absolute value is equal to or more than 3 at %, the gas barrier property is improved more when a film of the gas barrier film to be obtained is bent. Herein, the upper limit of the difference of $O_{max}$–$O_{min}$ is, although not particularly limited, preferably 50 at % or less and more preferably 40 at % or less considering the effect of suppressing/preventing an occurrence of cracks during bending of a gas barrier film.

In the present invention, in the barrier layer, the absolute value of a difference between the maximum value and the minimum value of the silicon atomic ratio in the silicon distribution curve (hereinbelow, also simply referred to as "difference of $Si_{max}$–$Si_{min}$") is preferably 10 at % or less, more preferably 7 at % or less, and even more preferably 3 at % or less. When the absolute value is 10 at % or less, the gas barrier property of the gas barrier film to be obtained is improved more. Herein, the lower limit of the difference of $Si_{max}$–$Si_{min}$ is not particularly limited because the effect of suppressing/preventing an occurrence of cracks during bending of a gas barrier film increase as the difference of $Si_{max}$–$Si_{min}$ decreases. However, considering the gas barrier property or the like, it is preferably 1 at % or more and more preferably 2 at % or more.

In the present invention, it is preferable that the total amount of carbon and oxygen atoms in film thickness direction of a barrier layer be almost constant. Accordingly, the gas barrier film exhibits suitable bending property so that an occurrence of cracks is effectively suppressed and prevented at the time of bending a gas barrier film. More specifically, with regard to an oxygen carbon distribution curve showing the relationship between the distance (L) from a surface of the barrier layer in film thickness direction of the barrier layer and ratio of the total amount of oxygen and carbon atoms (oxygen and carbon atomic ratio) relative to total amount of silicon atoms, oxygen atoms and carbon atoms, the absolute value of a difference between the maximum value and the minimum value of the oxygen and carbon atomic ratio in the oxygen carbon distribution curve (hereinbelow, also simply referred to as "difference of $OC_{max}$–$OC_{min}$") is preferably less than 5 at %, more preferably less than 4 at %, and even more preferably less than 3 at %. When the absolute value is less than 5 at %, the gas barrier property of the gas barrier film to be obtained is improved more. Meanwhile, the lower limit of the difference of $OC_{max}$–$OC_{min}$ is 0 at % because the smaller difference of $OC_{max}$–$OC_{min}$ is preferred more. However, it is sufficiently 0.1 at % or more.

The aforementioned silicon distribution curve, oxygen distribution curve, carbon distribution curve, and oxygen carbon distribution curve can be established by a so-called XPS depth profile measurement in which sequential surface composition analysis is performed by having both the X ray photoelectron spectroscopy (XPS) and ion sputtering of rare gas such as argon while exposing the inside of a sample. The distribution curve obtained by such XPS depth profile measurement can be established by having atomic ratio of each atom (unit: at %) at vertical axis and etching time (sputtering time) at horizontal axis. Meanwhile, with regard to a distribution curve of an element in which etching time is plotted at vertical axis, the etching time is roughly related to the distance (L) from a surface of the barrier layer in film thickness direction of the barrier layer. Thus, as a "distance from a surface of the barrier layer in film thickness direction of the barrier layer", the distance from a surface of the barrier layer which is calculated in view of the relationship between the etching speed and etching time employed for XPS depth profile measurement can be used. Meanwhile, the silicon distribution curve, oxygen distribution curve, carbon distribution curve, and oxygen carbon distribution curve can be established under the following measurement conditions.

(Measurement Conditions)

Ion species for etching: Argon (Ar$^+$)

Etching speed (values converted in terms of thermally oxidized SiO$_2$ film): 0.05 nm/sec Etching space (values converted in terms of SiO$_2$): 10 nm X ray photoelectron spectroscopy apparatus: type "VG Theta Probe" manufactured by Thermo Fisher Scientific X ray for irradiation: Single crystal spectrophotometric AlKα

Spot and size of X ray: oval with a size of 800×400 μm.

In the present invention, film thickness (dry film thickness) of the barrier layer is not particularly limited as long as the requirements (i) to (iii) are satisfied. For example, the film thickness of the barrier layer is preferably 20 to 3000 nm, more preferably 50 to 2500 nm, and even more preferably 100 to 1000 nm. With such film thickness, the gas barrier film can exhibit an excellent gas barrier property and the effect of suppressing/preventing an occurrence of cracks during bending. Furthermore, for a case in which the barrier layer consists of two or more layers, each barrier layer preferably has the thickness described above. Meanwhile, for a case in which the barrier layer consists of two or more layers, the total thickness of the barrier layer is, although not particularly limited, preferably 1000 to 2000 nm or so as a total barrier film thickness (dry film thickness). With such film thickness, the gas barrier film can exhibit an excellent gas barrier property and the effect of suppressing/preventing an occurrence of cracks during bending.

In the present invention, from the viewpoint of forming a barrier layer which is uniform over entire film surface and has an excellent gas barrier property, it is preferable that the barrier layer be substantially even in film surface direction (direction parallel to a surface of a barrier layer). As described herein, the expression "the barrier layer is substantially even in film surface direction" means that, when the aforementioned oxygen distribution curve, carbon distribution curve, and oxygen carbon distribution curve are established by XPS depth profile for measurement point of at any two points on a film surface of a barrier layer, the number of extreme value in the carbon distribution curve is same for those any two measurement points so that the absolute value of a difference between the maximum value and the minimum value of the carbon atomic ratio in each carbon distribution curve is identical to each other or has a difference of 5 at % or less.

Furthermore, in the present invention, it is preferable that the carbon distribution curve be substantially continuous. As described herein, the expression "the carbon distribution curve is substantially continuous" means that the carbon distribution curve includes no region in which carbon atomic ratio discontinuously changes. Specifically, with regard to a relationship between the distance (x, unit; nm) from a surface of a barrier layer in film thickness direction of at least one layer in the barrier layer which is calculated from etching speed and etching time and carbon atomic ratio (C, unit; at %), the conditions represented by the following Mathematical Formula 3 are satisfied.

[Mathematical Formula 3]

$$(dC/dx) \le 0.5 \qquad \text{Mathematical Formula 3}$$

In the gas barrier film according to the present invention, the barrier layer satisfying all the requirements (i) to (iii) may have only one layer or two or more layers. Furthermore, when there are two or more layers of a barrier layer, material of plural barrier layers may be either same or different from each other.

In the silicon distribution curve, the oxygen distribution curve, and the carbon distribution curve, when the silicon atomic ratio, oxygen atomic ratio, and carbon atomic ratio satisfy the condition represented by (i) above in at least 90% film thickness region of the barrier layer, the atomic content ratio of the silicon atom relative to the total amount of silicon atom, oxygen atom, and carbon atom in the barrier layer is preferably 20 to 45 at %, and more preferably 25 to 40 at %. Furthermore, the atomic content ratio of the oxygen atom relative to the total amount of silicon atom, oxygen atom, and carbon atom in the barrier layer is preferably 45 to 75 at %, and more preferably 50 to 70 at %. Furthermore, the atomic content ratio of the carbon atom relative to the total amount of silicon atom, oxygen atom, and carbon atom in the barrier layer is preferably 0.5 to 25 at %, and more preferably 1 to 20 at %.

According to the present invention, the method for forming a barrier layer is not particularly limited, and a method of a related art can be similarly used or used after suitable modification. The barrier layer is preferably formed by a chemical vapor phase growing method (CVD method), in particular, plasma chemical vapor phase growing method (plasma CVD, PECVD (plasma-enhanced chemical vapor deposition), hereinbelow, also simply referred to as a "plasma CVD method"). In particular, it is more preferably formed by a plasma CVD method in which a substrate is disposed on top of a pair of film forming rollers and plasma is generated by having discharge between the pair of film forming rollers.

Furthermore, regarding the arrangement of barrier layer, it can be disposed on top of a substrate although it is not particularly limited.

Hereinbelow, descriptions are given for a method of forming a barrier layer on a substrate by a plasma CVD method which is preferably used in the present invention.

[Method for Forming Barrier Layer]

It is preferable that the barrier layer according to the present invention be formed on a substrate surface. As a method for forming the barrier layer according to the present invention on a surface of a substrate, it is preferable to employ a plasma CVD method from the viewpoint of a gas barrier property. Meanwhile, the plasma CVD method can be a plasma CVD method of a Penning discharge plasma mode.

When plasma is generated by a plasma CVD method, it is preferable that plasma discharge be generated within a space between plural film forming rollers. It is more preferable that one pair of film forming rollers be used, a substrate is disposed for each of the pair of film forming rollers, and plasma is generated by having discharge between the pair of film forming rollers. By using one pair of film forming rollers, disposing a substrate on top of each of the pair of film forming rollers, and having plasma discharge between the pair of film forming rollers, not only the a surface part of a substrate which is present on one film forming roller can be formed into a film but also a surface of a substrate which is present on other film forming roller can be simultaneously formed into a film, and thus a thin film can be produced efficiently. In addition, compared to a conventional plasma CVD method which does not use a roller, the film forming speed can be doubled and also a film with almost the same structure can be formed. Accordingly, it is possible to increase at least two times the extreme values in a carbon distribution curve so that a layer satisfying the aforementioned requirements (i) to (iii) can be efficiently formed.

Furthermore, for having discharge between a pair of film forming rollers as described above, it is preferable that the polarity of the pair of film forming rollers be reversed alternately. Furthermore, the film forming gas used for such plasma CVD method preferably contains an organic silicon compound and oxygen. Content of the oxygen in the film forming gas is preferably less than a theoretical oxygen amount which is required for complete oxidation of the entire amount of the organic silicon compound in the film forming gas. Furthermore, with regard to the gas barrier film of the present invention, the barrier layer is preferably a layer formed by a continuous film forming process.

Furthermore, with regard to the gas barrier film of the present invention, the barrier layer is preferably formed by a roll-to-roll process on a surface of the substrate from the viewpoint of productivity. Furthermore, the apparatus which can be used for producing the barrier layer by plasma CVD method is, although not particularly limited, preferably an apparatus having at least one pair of film forming rollers and a plasma source and having a constitution allowing discharge between the pair of film forming rollers. For example, when the manufacturing apparatus illustrated in FIG. 1 is used, it is also possible to have manufacturing according to roll-to-roll process while using a plasma CVD method.

Hereinbelow, more detailed descriptions are given for a method for forming a barrier layer according to the present invention in view of FIG. 1. Meanwhile, FIG. 1 is a schematic drawing illustrating an example of a manufacturing apparatus that can be preferably used for manufacturing a barrier layer of the present invention. Furthermore, in the following descriptions and drawings, same symbols are given for the same or similar elements and redundant descriptions are not presented.

The manufacturing apparatus 31 illustrated in FIG. 1 includes the feeding roller 32, the conveying rollers 33, 34, 35, 36, the film forming rollers 39, 40, the gas supplying pipe 41, the power source 42 for generating plasma, the device 43, 44 for generating magnetic field which is installed inside the film forming rollers 39 and 40, and the take-up roller 45. Further, in this manufacturing apparatus, at least the film forming rollers 39, 40, the gas supplying pipe 41, the power source 42 for generating plasma, and the devices 43, 44 for generating magnetic field are disposed inside a vacuum chamber which is not illustrated. Furthermore, in this manufacturing apparatus 31, the aforementioned non-illustrated vacuum chamber is connected to a vacuum pump such that inside pressure of the vacuum chamber can be suitably adjusted by the vacuum pump.

In this manufacturing apparatus, each film forming roller is connected to the power source 42 for generating plasma such that a pair of film forming rollers (the film forming roller 39 and the film forming roller 40) can function as a pair of counter electrodes. As such, according this manufacturing apparatus 31, discharge can be generated in a space between the film forming roller 39 and the film forming roller 40 by supplying electric power with an aid of the power source 42 for generating plasma. Accordingly, plasma can be generated in a space between the film forming roller 39 and the film forming roller 40. Meanwhile, when the film forming roller 39 and the film forming roller 40 are also used as an electrode, their material or design can be suitably modified such that they can be also used as an electrode. Furthermore, in this manufacturing apparatus, a pair of film forming rollers (the film forming rollers 39 and 40) is preferably disposed such that the center axis is almost parallel on the same plane. By disposing a pair of film forming rollers (the film forming rollers 39 and 40) in such manner, the film forming speed can be doubled and also it is possible to increase at least twice the extreme values in a carbon distribution curve because a film with almost the same structure can be formed. Furthermore, according to this manufacturing apparatus, it is possible to form the barrier layer 3 on a surface of the substrate 2 by a CVD method, and also a barrier layer component can be additionally deposited on a surface of the substrate 2 on the film forming roller 40 while a barrier layer component is deposited on a surface of the substrate 2 on the film forming roller 39. As such, the barrier layer can be efficiently formed on a surface of the substrate 2.

Within the film forming roller 39 and the film forming roller 40, the device 43 and 44 for generating magnetic field, which are fixed so as not to rotate according to rotation of a film forming roller, are installed, respectively.

With regard to the devices 43 and 44 for generating magnetic field, which are installed on the film forming roller 39 and the film forming roller 40, respectively, the magnetic poles are preferably disposed such that there are no magnetic force lines between the device 43 for generating magnetic field which is installed on the film forming roller 39 at one side and the device 44 for generating magnetic field which is installed on the film forming roller 40 at the other side and each of the devices 43, 44 for generating magnetic field forms almost closed magnetic circuit. Disposing the devices 43, 44 for generating magnetic field is favorable in that forming of a magnetic field with expanded magnetic force lines can be promoted near the surface opposite to the film forming rollers 39, 40 and plasma can be easily bound to that expanded region, and thus the film forming efficiency can be enhanced.

It is also preferable that the devices 43, 44 for generating magnetic field, which are installed for the film forming roller 39 and the film forming roller 40, respectively, be provided with a magnetic pole of a race track shape which is extended long in roller axis direction, and with respect to the device 43 for generating magnetic field on one side and the device 44 for generating magnetic field on the other side, the magnetic poles are arranged such that facing magnetic poles have the same polarity. By installing the devices 43, 44 for generating magnetic field, magnetic field with race track shape can be easily formed near roller surface that is in contact with the opposite space (discharge area) along the length direction of a roller axis without having magnetic force lines present on the apparatus for generating magnetic field on the opposite roller side, and plasma can be concentrated to the magnetic field for each of the devices 43, 44 for generating magnetic field, and thus it is excellent in that the barrier layer 3 as a vapor deposition film can be efficiently formed by using wide substrate 2 wound in the roller width direction.

As for the film forming roller 39 and the film forming roller 40, a known roller can be suitably used. From the viewpoint of forming more efficiently a thin film, a roller having same diameter is preferably used as the film forming rollers 39 and 40. Furthermore, from the viewpoint of discharge conditions, chamber space, or the like, the diameter of the film forming rollers 39 and 40 is preferably within a range of 300 to 1000 mmϕ, in particularly within a range of 300 to 700 mmϕ. When the diameter of a film forming roller is 300 mmϕ or more, space for plasma discharge is not reduced so that there is no deterioration in productivity and application of entire heat from plasma discharge to the substrate 2 can be avoided to reduce damages on the substrate 2, and therefore desirable. Meanwhile, when the diameter of a film forming roller is 1000 mmϕ or less, a practical value can be maintained in terms of apparatus design including uniformity of a plasma discharge space, and therefore desirable.

In the manufacturing apparatus 31, the substrate 2 is disposed on a pair of film forming rollers (the film forming roller 39 and the film forming roller 40) such that each surface of the substrate 2 can face each other. By disposing the substrate 2 in such manner, when plasma is generated by performing discharge in a counter space between the film forming roller 39 and the film forming roller 40, each surface of the substrate 2 present between a pair of film forming rollers can be simultaneously prepared as a film. Specifically, with this manufacturing apparatus, a barrier layer component can be deposited on a surface of the substrate 2 on the film forming roller 39 and also a barrier layer component can be deposited on a surface of the substrate 2 on the film forming roller 40 by a plasma CVD method, and thus the barrier layer can be efficiently formed on a surface of the substrate 2.

A known roller can be suitably used as the feeding roller 32 and the conveying rollers 33, 34, 35, 36 that are used for the manufacturing apparatus. Furthermore, as for the take-up roller 45, any one capable of taking up the gas barrier film 1 having the barrier layer 3 formed on the substrate 2 can be used. A known roller can be suitably used without being particularly limited.

Furthermore, as the gas supplying pipe 41 and a vacuum pump, any one capable of supplying or discharging a raw material gas or the like at a predetermined rate can be suitably used.

Furthermore, the gas supplying pipe 41 as a gas supplying means is preferably installed on one side of a counter space (discharge area; film forming zone) between the film forming roller 39 and the film forming roller 40, and the vacuum pump (not illustrated) as a vacuum discharge means is preferably installed on the other side of a counter space. By disposing the gas supplying pipe 41 as a gas supplying means and a vacuum pump as a vacuum discharge means, the film forming gas can be efficiently supplied to a counter space between the film forming roller 39 and the film forming roller 40, and it is thus excellent in that the filming forming efficiency can be enhanced.

Furthermore, a power source of a known plasma generator can be used as the power source 42 for generating plasma. The power source 42 for generating plasma supplies electric power to the film forming roller 39 and the film forming roller 40 that are connected to the power source and enables use of them as a counter electrode for discharge. As the power source 42 for generating plasma, use of a source enabling alternate reverse of polarity of a pair of the film forming rollers (alternating power source) is preferable in that more efficient operation of plasma CVD can be achieved. Furthermore, as the power source 42 for generating plasma, a power source allowing application power of 100 W to 10 kW and alternating current frequency of 50 Hz to 500 kHz is more preferable in that more efficient operation of plasma CVD can be achieved. Furthermore, as the devices 43, 44 for generating magnetic field, a known magnetic field generator can be suitably used. Furthermore, as the substrate 2, a substrate on which the barrier layer 3 is formed in advance can be used in addition to the substrate used in the present invention. By using as the substrate 2 a substrate on which the barrier layer 3 is formed in advance, it is also possible to increase the film thickness of the barrier layer 3.

By using the manufacturing apparatus 31 illustrated in FIG. 1 and adjusting type of a raw material gas, power of an electrode drum of a plasma generator, pressure in a vacuum chamber, the diameter of a film forming roller, and conveyance speed of a film (substrate), the barrier layer of the present invention can be manufactured. Specifically, by using the manufacturing apparatus 31 illustrated in FIG. 1 and having discharge between a pair of film forming rollers (the film forming rollers 39 and 40) while supplying a film forming gas (raw material gas or the like) to a vacuum chamber, the film forming gas (raw material gas or the like) is decomposed by plasma and the barrier layer 3 is formed on a surface of the substrate 2 on the film forming roller 39 and on a surface of the substrate 2 on the film forming roller 40 by a plasma CVD method. At that time, magnetic field of a race track shape is formed near the roller surface in contact with a counter space (discharge area) along the length direction of a roller axis of the film forming rollers 39, 40, and plasma is concentrated to the magnetic field. Accordingly, when the substrate 2 passes point A of the film forming roller 39 and point B of the film forming roller 40 in FIG. 1, the highest value of a carbon distribution curve is formed in a barrier layer. On the other hand, when the substrate 2 passes points C1 and C2 of the film forming roller 39 and points C3 and C4 of the film forming roller 40 in FIG. 1, the lowest value of a carbon distribution curve is formed in a barrier layer. As such, five extreme values are generally formed for two film forming rollers. Furthermore, the distance between extreme values in the barrier layer (absolute value of a difference between the distance from a surface of the barrier layer in film thickness direction of the barrier layer (L) at one extreme value in the carbon distribution curve and L at the extreme value adjacent to the aforementioned extreme value) can be controlled based on revolution speed of the film forming rollers 39, 40 (conveyance speed of a substrate). Furthermore, during such film forming, the substrate 2 is conveyed by the feeding roller 32 or the film forming roller 39 so that the barrier layer 3 is formed on a surface of the substrate 2 by a continuous film forming process of roll-to-roll type.

As for the film forming gas (raw material gas or the like) which is supplied from the gas supplying pipe 41 to the counter space, raw material gas, reactive gas, carrier gas, or discharge gas can be used either singly or as a mixture of two or more types. The raw material gas in the filming forming gas which is used for forming the barrier layer 3 can be suitably selected and used depending on the material of the barrier layer 3 to be formed. Examples of the raw material gas which can be used include an organic silicon compound containing silicon or organic compound gas containing carbon. Examples of the organic silicon compound include hexamethyldisiloxane (HMDSO), hexamethyldisilane (HMDS), 1,1,3,3-tetra methyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane (TMOS), tetraethoxysilane (TEOS), phenyltrimethoxysilane, methyltriethoxysilane, and octamethylcyclotetra siloxane. Among these organic silicon compounds, from the viewpoint of the handling property of a compound and gas barrier property of a barrier layer to be obtained, hexamethyldisiloxane and 1,1,3,3-tetramethyldisiloxane are preferable. The organic silicon compound can be used either singly or in combination of two or more types. Examples of the organic compound gas containing carbon include methane, ethane, ethylene, and acetylene. With regard to the organic silicon compound and organic compound gas, a suitable raw material gas is selected depending on type of the barrier layer 3.

Furthermore, reactive gas can be also used as film forming gas in addition to the aforementioned raw material gas. As for the reactive gas, gas capable of reacting with the raw material gas to yield an inorganic compound such as oxides and nitrides can be suitably selected and used. As for the reactive gas for forming oxides, oxygen and ozone can be used, for example. Furthermore, as for the reactive gas for forming nitrides, nitrogen and ammonia can be used, for example. The reactive gas can be used either singly or in combination of two or more types. When it is necessary to form oxynitride, for example, it is possible that reactive gas for forming oxide and reactive gas for forming nitride can be used in combination.

As for the film forming gas, if necessary, carrier gas may be used for supplying the raw material gas to a vacuum chamber. Furthermore, as the filming forming gas, discharge gas may be used, if necessary, to generate plasma discharge. As the carrier gas and discharge gas, known gas can be suitably used, and rare gas such as helium, argon, neon, or xenon; and hydrogen can be used.

Regarding the ratio between the raw material gas and reactive gas when the film forming gas contains raw material gas and reactive gas, ratio of the reactive gas is preferably not exceedingly higher than the ratio of reactive gas which is theoretically required to have a complete reaction between the raw material gas and reactive gas. Not having exceedingly higher ratio of the reactive gas is favorable in that an excellent barrier property or bending resistance can be obtained from the barrier layer 3 to be formed. Furthermore, when the film forming gas contains the organic silicon compound and oxygen, it is preferably to have an amount which is equal to or less than the theoretical oxygen amount which is required to have complete oxidation of the entire organic silicon compound contained in the film forming gas.

Hereinbelow, more detailed descriptions are given with regard to the preferred ratio of raw material gas and reactive gas in the film forming gas in view of an example in which the film forming gas containing hexamethyldisiloxane (organic silicon compound, HMDSO, $(CH_3)_6Si_2O$) as raw material gas and oxygen ($O_2$) as reactive gas is used for manufacturing a silicon-oxygen based thin film.

For a case in which a silicon-oxygen based thin film is manufactured by a reaction, which is based on plasma CVD, of film forming gas containing hexamethyldisiloxane (HMDSO, $(CH_3)_6Si_2O$) as raw material gas and oxygen ($O_2$) as reactive gas, a reaction represented by the following Reaction Formula 1 is caused by the film forming gas to yield silicon dioxide.

[Chemical Formula 6]

$(CH_3)_6Si_2O+12O_2 \rightarrow 6CO_2+9H_2O+2SiO_2$     Reaction Formula 1

In the reaction, the amount of oxygen required for complete oxidation of 1 mol of hexamethyldisiloxane is 12 moles. For such reasons, when a complete reaction is allowed to occur while having oxygen at 12 moles or more relative to 1 mol of hexamethyldisiloxane in the film forming gas, an even silicon dioxide film is formed (carbon distribution curve does not exist), and thus a barrier layer satisfying all the requirements (i) to (iii) cannot be formed. Thus, when a barrier layer is formed in the present invention, it is preferable that the oxygen amount relative to 1 mol of hexamethyldisiloxane be less than 12 moles as a stoichiometric amount such that the reaction of the above Reaction Formula 1 cannot progress completely. Meanwhile, for the actual reaction occurring in a plasma CVD chamber, a complete reaction cannot be practically obtained even when the molar amount (flow amount) of oxygen as reactive gas is 12 times the molar amount (flow amount) of hexamethyldisiloxane as a raw material, because hexamethyldisiloxane as a raw material and oxygen as reactive gas are supplied from a gas supply part to a film forming region to form a film. Thus, it is believed that the complete reaction can be obtained only after supplying the oxygen in an amount which is excessively higher than the stoichiometric ratio (for example, to obtain silicon oxide by complete oxidation based on CVD, there is a case in which molar amount (flow amount) of oxygen is 20 times or higher than the molar amount (flow amount) of hexamethyldisiloxane as a raw material). For such reasons, the molar amount (flow amount) of oxygen relative to the molar amount (flow amount) of hexamethyldisiloxane as a raw material is preferably 12 times or less, which is a stoichiometric ratio (more preferably, it is 10 times or less). By containing hexamethyldisiloxane and oxygen at this ratio, carbon atoms or hydrogen atoms in incompletely oxidized hexamethyldisiloxane are introduced to a barrier layer, and thus a barrier satisfying all the requirements (i) to (iii) can be formed. Accordingly, the gas barrier film obtained therefrom can exhibit an excellent gas barrier property and bending resistance. Meanwhile, from the viewpoint of use for a flexible substrate for a device which requires transparency such as an organic EL element and a solar cell, the lower limit of the molar amount (flow amount) of oxygen with respect to the molar amount (flow amount) of hexamethyldisiloxane in the film forming gas is preferably higher than 0.1 times the molar amount (flow amount) of hexamethyldisiloxane. More preferably, it is higher than 0.5 times.

Furthermore, the pressure (vacuum level) inside a vacuum chamber can be suitably adjusted depending on type of a raw material gas or the like. However, it is preferably in a range of from 0.5 Pa to 50 Pa.

Furthermore, to have discharge between the film forming roller 39 and the film forming roller 40 according to the plasma CVD method, electric power applied to an electrode drum, which is connected to the power source 42 for generating plasma (in this embodiment, it is installed at the film forming rollers 39 and 40) is preferably in a range of from 0.1 to 10 kW, although it cannot be uniformly defined as it can be suitably defined by the type of a raw material gas or pressure in a vacuum chamber or the like. When the application power is 100 W or more, an occurrence of particles can be sufficiently suppressed. On the other hand, when it is 10 kW or less, heat generated during film forming can be suppressed so than an increase in substrate surface temperature during film forming can be suppressed. Thus, it is excellent in that the substrate is not lost against heat and an occurrence of wrinkles can be prevented during film forming.

The conveyance speed (line speed) of the substrate 2 can be suitably adjusted according to the type of a raw material gas or pressure in a vacuum chamber. However, it is preferably in a range of from 0.25 to 100 m/min, and more preferably in a range of from 0.5 to 20 m/min. When the line speed is equal to or higher than 0.25 m/min, an occurrence of substrate wrinkles which is caused by heat can be prevented effectively. On the other hand, when it is 100 m/min or less, it is excellent in that sufficient film thickness of a barrier layer can be ensured without compromising the productivity.

As described above, the more preferred mode of the present embodiment is characterized in that film forming of a barrier layer according to the present invention is performed by plasma CVD method in which a plasma CVD apparatus (roll-to-roll process) having counter roll electrodes illustrated in FIG. 1 is used. That is because, when mass production is performed by using a plasma CVD apparatus (roll-to-roll process) having counter roll electrodes, a barrier layer having excellent flexibility (bending property) and also the mechanical strength, in particular, durability during roll-to-roll conveyance, and barrier performance can be efficiently manufactured. Such manufacturing apparatus is also excellent in that a gas barrier film required to have durability against temperature change, which is used for a solar cell or an electronic compartment, can be easily produced in a large amount at low cost.

[Smooth Layer (Underlayer, Primer Layer)]

The gas barrier film according to the present invention may have a smooth layer (underlayer, primer layer) on a substrate surface having a barrier layer, preferably between a substrate and a silicon-containing film. The smooth layer is provided for flattening the rough surface of a substrate, on which projections and the like are present, or flattening a barrier layer by filling up unevenness and pinholes generated thereon by projections present on the substrate. Such a smooth layer can be formed of any material. However, it preferably contains a carbon-containing polymer, and more preferably, it consists of a carbon-containing polymer. Specifically, it is preferable that the gas barrier film of the present invention further have a smooth layer containing a carbon-containing polymer between a substrate and a barrier layer.

Furthermore, the smooth layer contains a carbon-containing polymer, and preferably a thermosetting resin. The thermosetting resin is not particularly limited, and examples thereof include an active energy ray setting resin which is obtained by irradiating an active energy ray setting resin with active energy ray such as ultraviolet ray and a thermosetting resin which is obtained by heating and setting a thermosetting resin. The setting resin can be used either singly or in combination of two or more types.

Examples of the active energy ray setting material used for forming of the smooth layer include a composition containing an acrylate compound, a composition containing an acrylate compound and a mercapto compound having a thiol group, and a composition with a polyfunctional acrylate monomer such as epoxy acrylate, urethane acrylate, polyester acrylate, polyether acrylate, polyethylene glycol acrylate, or glycerol methacrylate. Specifically, a UV curable organic/inorganic hybrid hard coating material OPSTAR (registered trademark) series (a compound obtained by binding an organic compound having a polymerizable unsaturated group to silica microparticles) manufactured by JSR Corporation may be used. Further, any mixture of the compositions described above can also be used, and it is not particularly limited as long as it is an active energy ray setting material containing a reactive monomer having at least one photopolymerizable unsaturated bond in a molecule.

Examples of the reactive monomer having at least one photopolymerizable unsaturated bond in a molecule include methyl acrylate, ethyl acrylate, n-propylacrylate, isopropyl acrylate, n-butyl acrylate, isobutyl acrylate, tert-butyl acrylate, n-pentyl acrylate, n-hexyl acrylate, 2-ethylhexyl acrylate, n-octyl acrylate, n-decyl acrylate, hydroxyethyl acrylate, hydroxypropyl acrylate, allyl acrylate, benzyl acrylate, butoxyethyl acrylate, butoxyethylene glycol acrylate, cyclohexyl acrylate, dicyclopentanyl acrylate, 2-ethylhexylacrylate, glycerolacrylate, glycidylacrylate, 2-hydroxyethyl acrylate, 2-hydroxypropyl acrylate, isobonyl acrylate, isodecyl acrylate, isooctyl acrylate, lauryl acrylate, 2-methoxyethyl acrylate, methoxyethylene glycol acrylate, phenoxyethyl acrylate, stearyl acrylate, ethylene glycol diacrylate, diethylene glycol diacrylate, 1,4-butanediol diacrylate, 1,5-pentanediol diacrylate, 1,6-hexanediol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethyltrimethylolpropane triacrylate, pentaerythritol triacrylate, pentaerythritol tetraacrylate, ethylene oxide-modified pentaerythritol triacrylate, ethylene oxide-modified pentaerythritol tetraacrylate, propylene oxide-modified pentaerythritol triacrylate, propylene oxide-modified pentaerythritol tetraacrylate, triethylene glycol diacrylate, polyoxypropyltrimethylolpropane triacrylate, butylene glycol diacrylate, 1,2,4-butanediol triacrylate, 2,2,4-trimethyl-1,3-pentadiol diacrylate, diallyl fumalate, 1,10-decanediol dimethyl acrylate, pentaerythritol hexaacrylate, those with the acrylate of the above-mentioned monomers replaced by methacrylate, γ-methacryloxypropyltrimethoxysilane and 1-vinyl-2-pyrrolidone. The reactive monomers described above can be used alone or as a mixture of two or more thereof, or a mixture with other compounds.

The composition containing an active energy ray setting material preferably contains a photopolymerization initiator.

Examples of the photopolymerization initiator include benzophenone, methyl o-benzoylbenzoate, 4,4-bis(dimethylamine)benzophenone, 4,4-bis(diethylamine)benzophenone, α-amino.acetophenone, 4,4-dicyclobenzophenone, 4-benzoyl-4-methyldiphenylketone, dibenzylketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthone, 2-methylthioxanthone, 2-chlorothioxanthone, 2-isopropylthioxanthone, diethylthioxanthone, benzyldimethylketal, benzylmethoxyethylacetal, benzoin methyl ether, benzoin butyl ether, anthraquinone, 2-tert-butylanthraquinone, 2-amylanthraquinone, β-chloroanthraquinone, anthrone, benzanthrone, dibenzsuberon, methyleneanthrone, 4-azidobenzylacetophenone, 2,6-bis(p-azidobenzylidene)cyclohexane, 2,6-bis(p-azidobenzylidene)-4-methylcyclohexanone, 2-phenyl-1,2-butanedione-2-(o-methoxycarbonyl)oxime, 1-phenyl-propanedione-2-(o-ethoxycarbonyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl[4-(methylthio)phenyl]-2-monopholino-1-propane, 2-benzyl-2-dimethylamino-1-(4-monopholinophenyl)-butanone-1, naphthalenesulfonyl chloride, quinolinesulfonyl chloride, n-phenylthioacridone, 4,4-azobisisobutyronitrile, diphenyl disulfide, benzothiazole disulfide, triphenylphosphine, camphorquinone, carbon tetrabromide, tribromophenylsulfone, benzoin peroxide, and combinations of photo-reductive dyes such as eosin and methylene blue and reducing agents such as ascorbic acid and triethanolamine, and these photopolymerization initiators can be alone or in combination of two or more thereof.

Specific examples of the thermosetting material include Tutoprom series manufactured by Clariant (organic polysilazane), SP COAT heat resistant clear painting manufactured by Ceramic Coat Co., Ltd., nanohybrid silicone manufactured by Adeka Corporation, UNIDIC (registered trademark) V-8000 series, EPICLON (registered trademark), and EXA-4710 (ultrahigh heat resistant epoxy resin) manufactured by DIC Corporation, silicon resin X-12-2400 (product name) manufactured by Shin-Etsu Chemical Co., Ltd., inorganic/organic nanocomposite material SSG coat manufactured by Nitto Boseki Co., Ltd., a thermosetting urethane resin consisting of acryl polyol and isocyanate prepolymer, a phenol resin, a urea melamine resin, an epoxy resin, an unsaturated polyester resin, and a silicon resin, and a polyamide amine-epichlorohydrin resin.

The method of forming the smooth layer is not particularly limited, but a method in which a coating film is formed by coating a coating liquid containing a setting material by a wet coating method such as a spin coating method, a spray coating method, a blade coating method, a dipping method, or a Gravure printing, or a dry coating method such as a vapor deposition method, and the coating film is set and formed by irradiation of active energy ray such as visible ray, infrared ray, ultraviolet ray, X ray, α ray, β ray, γ ray, or electron beam and/or by heating is preferable. Meanwhile, as a method for applying active energy ray, mention can be made for a method in which ultraviolet ray having a wavelength in a range of 100 to 400 nm and preferably of 200 to 400 nm is irradiated by using an ultra-high pressure mercury lamp, a high pressure mercury lamp, a low pressure mercury lamp, a carbon arc, a metal halide lamp or the like, or electron beam having a wavelength in a range of 100 nm or less, which is emitted from a scan type or curtain type electron beam accelerator, is irradiated.

Examples of the solvent which is used for forming a smooth layer by using a coating liquid in which a setting material is dissolved or dispersed in a solvent include, although not particularly limited, alcohols such as methanol, ethanol, n-propyl alcohol, isopropyl alcohol, ethylene glycol, and propylene glycol; terpenes such as α- or β-terpineol; ketones such as acetone, methyl ethyl ketone, cyclohexanone, N-methyl-2-pyrrolidone, diethyl ketone, 2-heptanone, and 4-heptanone; aromatic hydrocarbons such as toluene, xylene, and tetramethyl benzene; glycol ethers such as cellosolve, methyl cellosolve, ethyl cellosolve, carbitol, methyl carbitol, ethyl carbitol, butyl carbitol, propylene glycol monomethyl ether, propylene glycol monoethyl ether, dipropylene glycol monomethyl ether, dipropylene glycol monoethyl ether, triethylene glycol monomethyl ether, and triethylene glycol monoethyl ether; ester acetates such as ethyl acetate, butyl acetate, cellosolve acetate, ethyl cellosolve acetate, butylcellosolve acetate, carbitol acetate, ethyl carbitol acetate, butyl carbitol acetate, propylene glycol monomethyl ether acetate, propylene glycol monoethyl ether acetate, 2-methoxyethyl acetate, cyclohexyl acetate, 2-ethyoxyethyl acetate, 3-methoxybutyl acetate, diethylene glycol dialkyl ether, dipropylene glycol dialkyl ether, ethyl-3-ethoxy propionate, and methyl benzoate, N,N-dimethylacetamide and N,N-dimethyl formamide.

The smooth layer may contain, as necessary, in addition to the materials described above, additives such as a thermoplastic resin, an antioxidant, an ultraviolet absorbing agent, and a plasticizer. Furthermore, an appropriate resin or additives may be added in order to improve a film forming property, and to suppress generation of pinholes. Examples of the thermoplastic resin include cellulose derivatives such as acetyl cellulose, nitrocellulose, acetyl butyl cellulose, ethyl cellulose and methyl cellulose, vinyl-based resins such as vinyl acetate and copolymers thereof, vinyl chloride and copolymers thereof and vinylidene chloride and copolymers thereof, acetal-based resins such as polyvinyl formal and polyvinyl butyral, acryl-based resins such as an acryl resin and copolymers thereof and a methacryl resin and copolymers thereof, a polystyrene resin, a polyamide resin, a linear polyester resin and a polycarbonate resin.

The smoothness of the smooth layer is a value expressed by a surface roughness defined in JIS B 0601:2001 and the maximum cross-sectional height Rt (p) is preferably 10 nm to 30 nm.

The surface roughness is measured employing an AFM (atomic force microscope), specifically from a cross-sectional curve of irregularities that is continuously measured by a detector having a probe with extremely small tip radius, and it indicates the roughness regarding amplitude of tiny irregularities after measuring several times a region with measurement direction of several tens of micrometers by a probe with extremely small tip radius.

Film thickness of the smooth layer is, although not particularly limited, preferably in a range of 0.1 to 10 μm.

[Anchor Coat Layer]

On a surface of the substrate according to the present invention, an anchor coat layer can be formed as an easy adhesion layer for the purpose of enhancing the adhesiveness (adhesion). Examples of the anchor coat agent used for the anchor coat layer include a polyester resin, an isocyanate resin, a urethane resin, an acryl resin, an ethylene vinyl alcohol resin, a vinyl modified resin, an epoxy resin, a modified styrene resin, a modified silicon resin, and alkyl titanate, and one type or two or more types thereof can be used. As an anchor coat agent, a commercially available product can be used. Specifically, a siloxane-based ultraviolet ray curable polymer solution (3% isopropyl alcohol solution of X-12-2400 manufactured by Shin-Etsu Chemical Co., Ltd.) can be used.

A known additive can be added to the anchor coat agent. Further, coating of the anchor coat agent can be performed by coating on a substrate by a known method such as roll coating, Gravure coating, knife coating, dip coating, and spray coating, and drying and removing a solvent, a diluent, or the like. The coating amount of the anchor coat agent is preferably 0.1 to 5 g/m$^2$ or so (in dry state). Meanwhile, a commercially available substrate adhered with an easy adhesion layer can be also used.

Alternatively, the anchor coat layer can be also formed by a vapor phase method such as physical vapor deposition method or chemical vapor deposition method. For example, as described in JP2008-142941A, an inorganic film having silicon oxide as a main component can be formed for the purpose of improving adhesiveness or the like.

Furthermore, thickness of the anchor coat layer is, although not particularly limited, preferably 0.5 to 10.0 μm or so.

[Bleed Out Preventing Layer]

In the gas barrier film of the present invention, a bleed out preventing layer can be further included. The bleed out preventing layer is provided on the opposite surface of the substrate having a smooth layer for the purpose of suppressing such a phenomenon that unreacted oligomers and so on are transferred from the interior to the surface of the film substrate to contaminate the contact surface when the film having the smooth layer is heated. The bleed out preventing layer may have essentially the same constitution as that of the smooth layer as long as it has the function described above.

As a compound which can be included in the bleed-out preventing layer, a hard coating agent such as a polyvalent unsaturated organic compound having two or more polymerizable unsaturated groups in a molecule or a monovalent unsaturated organic compound having one polymerizable unsaturated group in a molecule can be mentioned.

Here, examples of the polyvalent unsaturated organic compound include ethylene glycol di(meth)acrylate, diethylene glycol di(meth)acrylate, glycerol di(meth)acrylate, glycerol tri(meth)acrylate, 1,4-butanediol di(meth)acrylate, 1,6-hexanediol di(meth)acrylate, neopentyl glycol di(meth)acrylate, trimethylol propane tri(meth)acrylate, dicyclopentanyl di(meth)acrylate, pentaerythritol tri(meth)acrylate, pentaerythritol tetra(meth)acrylate, dipentaerythritol hexa(meth) acrylate, dipentaerythritol monohydroxypenta(meth)acrylate, ditrimethylolpropanetetra(meth)acrylate, diethylene glycol di(meth)acrylate, polyethylene glycol di(meth)acrylate, tripropylene glycol di(meth)acrylate, and polypropylene glycol di(meth)acrylate.

Furthermore, examples of the monovalent unsaturated organic compound include methyl(meth)acrylate, ethyl (meth)acrylate, propyl(meth)acrylate, butyl(meth)acrylate, 2-ethylhexyl(meth)acrylate, isodecyl(meth)acrylate, lauryl (meth)acrylate, stearyl(meth)acrylate, allyl(meth)acrylate, cyclohexyl(meth)acrylate, methylcyclohexyl(meth)acrylate, isobornyl(meth)acrylate, 2-hydroxyethyl(meth)acrylate, 2-hydroxypropyl(meth)acrylate, glycerol(meth)acrylate, glycidyl(meth)acrylate, benzyl(meth)acrylate, 2-ethoxyethyl (meth)acrylate, 2-(2-ethoxyethoxyl)ethyl(meth)acrylate, butoxyethyl(meth)acrylate, 2-methoxyethyl(meth)acrylate, methoxydiethylene glycol(meth)acrylate, methoxytriethylene glycol(meth)acrylate, methoxypolyethylene glycol (meth)acrylate, 2-methoxypropyl(meth)acrylate, methoxydipropylene glycol(meth)acrylate, methoxytripropylene glycol(meth)acrylate, methoxypolypropylene glycol(meth) acrylate, polyethylene glycol(meth)acrylate, and polypropylene glycol(meth)acrylate.

As other additives, a matting agent may be contained. As the matting agent, inorganic particles having an average particle diameter of about 0.1 to 5 µm are preferable.

As these inorganic particles, silica, alumina, talk, clay, calcium carbonate, magnesium carbonate, barium sulfate, aluminum hydroxide, titanium dioxide, zirconium oxide and the like can be used alone or in combination of two or more thereof.

Here, it is desirable that the matting agent formed of inorganic particles be mixed at a ratio of 2 parts by weight or more, preferably 4 parts by weight or more, and more preferably 6 parts by weight or more, and 20 parts by weight or less, preferably 18 parts by weight or less, and more preferably 16 parts by weight or less based on 100 parts by weight of the solid content of the hard coating agent.

The bleed out preventing layer may also contain a thermoplastic resin, a thermosetting resin, an ionizing irradiation-curable resin, a photopolymerization initiator and so on as components other than the hard coating agent and matting agent.

Examples of the thermoplastic resin include cellulose derivatives such as acetyl cellulose, nitrocellulose, acetyl butyl cellulose, ethyl cellulose and methyl cellulose, vinyl-based resins such as vinyl acetate and copolymers thereof, vinyl chloride and copolymers thereof and vinylidene chloride and copolymers thereof, acetal-based resins such as polyvinyl formal and polyvinyl butyral, acryl-based resins such as an acryl resin and copolymers thereof and a methacryl resin and copolymers thereof, a polystyrene resin, a polyamide resin, a linear polyester resin and a polycarbonate resin.

Furthermore, examples of the thermosetting resin include a thermosetting urethane resin formed of an acrylic polyol and an isocyanate prepolymer, a phenol resin, a urea melamine resin, an epoxy resin, an unsaturated polyester resin and a silicon resin.

As the ionizing irradiation-curable resin, one that is cured by applying an ionizing irradiation (ultraviolet ray or electron beam) to an ionizing irradiation-curable coating prepared by mixing one type or two or more of photopolymerizable prepolymers, photopolymerizable monomers and so on can be used. An acryl-based prepolymer, which has two or more acryloyl groups in one molecule and is formed into a three-dimensional meshwork structure by crosslinking-curing, is especially suitably used as the photopolymerizable prepolymer. A urethane acrylate, polyester acrylate, epoxy acrylate, melamine acrylate or the like can be used as the acryl-based prepolymer. The polyvalent unsaturated organic compound described above, or the like can be used as the photopolymerizable monomer.

Examples of the photopolymerization initiator include acetophenone, benzophenone, Michler's ketone, benzoin, benzyl methyl ketal, benzoin benzoate, hydroxycyclohexyl phenyl ketone, 2-methyl-1-(4-(methylthio)phenyl)-2-(4-morpholinyl)-1-propane, α-acyloxime ester and thioxanthones.

The bleed out preventing layer described above can be formed by mixing a hard-coating agent and other components as necessary, preparing a coating liquid from the mixture with a diluent solvent that is appropriately used as necessary, coating the surface of the substrate film with the coating liquid by a previously well-known coating method, and thereafter curing the coated film by applying an ionizing irradiation. A process for applying an ionizing irradiation can be carried out by applying an ultraviolet ray having a wavelength in a range of 100 to 400 nm and preferably of 200 to 400 nm, which is emitted from an ultra-high pressure mercury lamp, a high pressure mercury lamp, a low pressure mercury lamp, a carbon arc, a metal halide lamp or the like, or applying an electron beam having a wavelength in a range of no more than 100 nm, which is emitted from a scan-type or curtain-type electron beam accelerator.

It is desirable that the thickness of the bleed out preventing layer be 1 to 10 µm, and preferably 2 to 7 µm. By ensuring that the thickness is 1 µm or more, the heat resistance as a film is easily made sufficient, and by ensuring that the thickness is 10 µm or less, the balance of the optical characteristics of the smooth film is easily adjusted and curls of the barrier film can be easily suppressed in a case where the smooth layer is provided on one surface of the transparent polymer film.

With regard to the gas barrier film of the present invention, those described in paragraphs "0036" to "0038" of JP 2006-289627 A can be suitably employed in addition to those described above.

<Electronic Device>

The gas barrier film of the present invention can be preferably used for a device of which performance is deteriorated by chemical components in the air (oxygen, water, nitrogen oxides, sulfur oxides, ozone, or the like). Examples of the device include an organic EL element, a liquid crystal display element (LCD), a thin film transistor, a touch panel, an electronic paper, and a solar cell (PV). From the viewpoint of obtaining more efficiently the effect of the present invention, it is preferably used for an organic EL element or a solar cell, and particularly preferably for an organic EL element.

The gas barrier film of the present invention can be also used for film sealing of a device. Specifically, it relates to a method for forming a gas barrier film of the present invention on a surface of a device itself as a support. It is also possible that the device is covered with a protective layer before forming a gas barrier film.

The gas barrier film of the present invention can be also used as a substrate of a device or as a film for sealing by solid sealing method. The solid sealing method indicates a method in which a protective layer is formed on a device and an adhesive layer and a gas barrier film are overlaid followed by setting. The adhesive is not particularly limited, and examples thereof include a thermosetting epoxy resin and a photocurable acrylate resin.

(Organic EL Element)

Examples of an organic EL element using a gas barrier film are described in detail in JP 2007-30387 A.

(Liquid Crystal Display Element)

A reflection type liquid crystal display element has a configuration in which, in the order from the bottom, a base plate, a reflective electrode, a lower orientation film, a liquid crystal layer, an upper orientation film, a transparent electrode, a top plate, a λ/4 plate, and a polarizing plate are included. The gas barrier film of the present invention can be used as a transparent electrode substrate or a top plate. In the case of color display, it is preferable that a color filter layer be further formed between a reflective electrode and a lower orientation film, or between an upper orientation film and a transparent electrode. A transmission type liquid crystal display element has a configuration in which, in the order from the bottom, a backlight, a polarizing plate, a λ/4 plate, a lower transparent electrode, a lower orientation film, a liquid crystal layer, an upper orientation film, an upper transparent electrode, a top plate, a λ/4 plate, and a polarizing plate are included. In the case of color display, it is preferable that a color filter layer be further formed between a lower transparent electrode and a lower orientation film, or between an upper orientation film and a transparent electrode. Type of a liquid crystal is not particularly limited, but it is preferably TN type (Twisted Nematic), STN type (Super Twisted Nematic) or HAN type (Hybrid Aligned Nematic), VA type (Vertically Alignment), ECB type (Electrically Controlled Birefringence), OCB type (Optically Compensated Bend), IPS type (In-Plane Switching), or CPA type (Continuous Pinwheel Alignment).

(Solar Cell)

The gas barrier film of the present invention can be also used as a sealing film of a solar cell element. Herein, it is preferable that the gas barrier film of the present invention be sealed such that the barrier layer is present close to a solar cell element. The solar cell element for which the gas barrier film of the present invention is preferably used is not particularly limited, but examples thereof include a monocrystal silicon solar cell element, a polycrystal silicon solar cell element, an amorphous silicon solar cell element consisting of a single attachment type or a tandem structure type, a Group III-V compound semiconductor solar cell element with gallium arsenic (GaAs) or indium phosphorus (InP), Group II-VI compound semiconductor solar cell element with cadmium tellurium (CdTe), Group I-III-VI compound semiconductor solar cell element with copper/indium/selenium system (so called, CIS system), copper/indium/gallium/selenium system (so called, CIGS system), copper/indium/gallium/selenium/sulfur system (so called, CIGSS system), a dye sensitized solar cell element, and an organic solar cell element. Among them, in the present invention, it is preferable that the solar cell element be a Group I-III-VI compound semiconductor solar cell element such as copper/indium/selenium system (so called, CIS system), copper/indium/gallium/selenium system (so called, CIGS system), or copper/indium/gallium/selenium/sulfur system (so called, CIGSS system).

(Others)

Other application examples include a thin film transistor described in JP H10-512104 W, a touch panel described in JP H05-127822 A, JP 2002-48913 A, or the like, and an electronic paper described in JP 2000-98326 A.

<Optical Member>

The gas barrier film of the present invention can be also used as an optical member. Examples of the optical member include a circularly polarizing plate.

(Circularly Polarizing Plate)

By using the gas barrier film of the present invention as a substrate and laminating a λ/4 plate and a polarizing plate, a circularly polarizing plate can be produced. In that case, the lamination is performed such that the slow phase axis of a λ/4 plate and an absorption axis of a polarizing plate form an angle of 45°. As for the polarizing plate, those stretched in 45° direction relative to the length direction (MD) are preferably used, and for example those described in JP 2002-865554 A can be preferably used.

EXAMPLES

Hereinbelow, the effect of the present invention is described specifically by referring to Examples and Comparative Examples given below, however, the technical scope of the present invention is not limited to Examples. In Examples, the term "parts" or "%" is used. Unless particularly mentioned, this represents "parts by weight" or "% by weight". Furthermore, regarding the following operations, the operations and measurements of physical properties or the like are performed under conditions of room temperature (20 to 25° C.)/relative humidity of 40 to 50%, unless specifically described otherwise.

<Preparation of Substrate 1>

As a substrate, a polyester film (super-low heat shrinkage) PET Q83 (manufactured by Teijin Dupont Films Japan Ltd.) having a thickness of 125 µm, of which both surfaces are subjected to an easy adhesion treatment, was used.

After a UV curable organic/inorganic hybrid hard coating material OPSTAR (registered trademark) 27535 (manufactured by JSR Corporation) serving as a photosensitive resin was coated on one surface of the aforementioned substrate so as to have a film thickness of 4.0 µm after drying. The obtained coating film was irradiated under a high pressure mercury lamp and cured to form a bleed out preventing layer. Meanwhile, the irradiation was performed under air atmosphere with irradiation energy amount of 1.0 J/cm$^2$ at temperature of 80° C. for 3 minutes.

A UV curable type organic/inorganic hybrid hard coating material OPSTAR (registered trademark) 27501 (manufactured by JSR Corporation) serving as a photosensitive resin was coated, on a surface opposite to the surface on which the bleed out preventing layer is formed, so as to have a film thickness of 4.0 µm after drying. The obtained coating film was irradiated under a high pressure mercury lamp and cured to form a smooth layer. Meanwhile, the irradiation was performed under air atmosphere with irradiation energy amount of 1.0 J/cm$^2$ at temperature of 80° C. for 3 minutes.

The 10-point average surface roughness (Rz) and the center axis average roughness (Ra) were measured for the smooth layer of the substrate 1 having an intermediate layer (bleed out preventing layer and smooth layer) obtained as described above. The Rz and Ra were measured by the method described in JIS B0601:2001. Specifically, the measurement was carried out by employing an AFM (atomic force microscope) SPI3800N DFM (manufactured by SII Nanotechnology Inc.) as an apparatus. With a single measurement within the range of 80 µm×80 µm, measurement was conducted three times while changing measurement locations. As a result, it was found that Rz is 20 nm and Ra is 1 nm.

<Manufacture of Gas Barrier Film>

Comparative Example 1-1

The coating liquid 1 was prepared as follows: a dibutyl ether solution containing 20% by weight of perhydropolysilazane (AQUAMICA (registered trademark) NN120-20: produced by AZ electronic materials Co., Ltd.) and a dibutyl ether solution containing 1% by weight of an amine catalyst (N,N,N',N'-tetramethyl-1,6-diaminohexane) and 19% by weight perhydropolysilazane (AQUAMICA (registered trademark) NAX120-20: produced by AZ electronic materials Co., Ltd.) were mixed at a ratio of 4:1.

The coating liquid 1 prepared from above was diluted with dibutyl ether, and it was coated on the substrate 1 by using a spin coater such that the film thickness after drying is 200 nm. By drying it for 2 minutes at 100° C., a coating film was obtained. The obtained coating film was irradiated with vacuum ultraviolet ray (MODEL: MECL-M-1-200, excimer illuminator manufactured by M. D. COM. Inc., wavelength of 172 nm, stage temperature of 100° C., integrated light amount of 3 J/cm$^2$, and oxygen concentration of 0.1% by volume) to produce a gas barrier film.

Comparative Example 1-2

By adding 16 ml of dibutyl ether to 0.176 g of aluminum tri sec-butoxide (manufactured by Wako Pure Chemical Industries, Ltd.) followed by addition of 2.97 g of the coating liquid 1, the coating liquid 2 was prepared.

Film forming was carried out in the same manner as Comparative Example 1-1 except that the coating liquid 2 which has been prepared above is used instead of the coating liquid 1. As a result, a gas barrier film was manufactured.

Comparative Example 1-3

By adding 18.1 ml of dibutyl ether to 0.576 g of aluminum tri sec-butoxide (manufactured by Wako Pure Chemical Industries, Ltd.) followed by addition of 0.97 g of the coating liquid 1, the coating liquid 3 was prepared.

Film forming was carried out in the same manner as Comparative Example 1-1 except that the coating liquid 3 which has been prepared above is used instead of the coating liquid 1. As a result, a gas barrier film was manufactured.

Comparative Example 1-4

By adding 16.6 ml of dibutyl ether to 0.287 g of aluminum tri sec-butoxide (manufactured by Wako Pure Chemical Industries, Ltd.) followed by addition of 2.4 g of the coating liquid 1, the coating liquid 4 was prepared.

Film forming was carried out in the same manner as Comparative Example 1-1 except that the coating liquid 4 which has been prepared above is used instead of the coating liquid 1 and the integrated light amount is changed to 1 J/cm$^2$. As a result, a gas barrier film was manufactured.

Comparative Example 1-5

By adding 24.6 ml of dibutyl ether to 0.3 g of trimethylamine borane (manufactured by Kanto Chemical Co., Inc.) followed by addition of 4.2 g of the coating liquid 1, the coating liquid 5 was prepared.

Film forming was carried out in the same manner as Comparative Example 1-1 except that the coating liquid 5 which has been prepared above is used instead of the coating liquid 1. As a result, a gas barrier film was manufactured.

Comparative Example 1-6

By adding 26 ml of dibutyl ether to 0.69 g of 2,4,6-triphenylborazine (manufactured by SIGMA-ALDRICH) followed by addition of 2.3 g of the coating liquid 1, the coating liquid 6 was prepared.

Film forming was carried out in the same manner as Comparative Example 1-1 except that the coating liquid 6 which has been prepared above is used instead of the coating liquid 1. As a result, a gas barrier film was manufactured.

Comparative Example 1-7

After adding 51.9 ml of dehydrated xylene to 0.002 g of tris(dibutyl sulfide) rhodium trichloride (manufactured by Gelest, Inc.), 10 g of polysilazane/xylene solution (NN110A-20, manufactured by AZ ELECTRONIC MATERIALS) was added followed by stirring for 1 hour at 60° C. to prepare the coating liquid 7.

The coating liquid 7 was coated on the substrate 1 by using a spin coater such that the film thickness after drying is 300 nm. By drying it for 10 minutes at 80° C., a coating film was obtained. The obtained coating film was irradiated with vacuum ultraviolet ray (MODEL: MECL-M-1-200, excimer illuminator manufactured by M. D. COM. Inc., wavelength of 172 nm, stage temperature of 100° C., integrated light amount of 3 J/cm$^2$, and oxygen concentration of 0.1% by volume) to produce a gas barrier film.

Example 1-1

By adding 16 ml of dibutyl ether to 0.176 g of aluminum tri sec-butoxide (manufactured by Wako Pure Chemical Industries, Ltd.) followed by addition of 2.97 g of the coating liquid 1, the coating liquid 8 was prepared.

Film forming was carried out in the same manner as Comparative Example 1-1 except that the coating liquid 8 which has been prepared above is used instead of the coating liquid 1. As a result, a gas barrier film was manufactured.

Example 1-2

By adding 16.6 ml of dibutyl ether to 0.287 g of aluminum tri sec-butoxide (manufactured by Wako Pure Chemical Industries, Ltd.) followed by addition of 2.42 g of the coating liquid 1, the coating liquid 9 was prepared.

Film forming was carried out in the same manner as Comparative Example 1-1 except that the coating liquid 9 which has been prepared above is used instead of the coating liquid 1. As a result, a gas barrier film was manufactured.

Example 1-3

By adding 17.3 ml of dibutyl ether to 0.418 g of aluminum tri sec-butoxide (manufactured by Wako Pure Chemical Industries, Ltd.) followed by addition of 1.76 g of the coating liquid 1, the coating liquid 10 was prepared.

Film forming was carried out in the same manner as Comparative Example 1-1 except that the coating liquid 10 which has been prepared above is used instead of the coating liquid 1. As a result, a gas barrier film was manufactured.

Example 1-4

By adding 26.3 ml of dibutyl ether to 0.74 g of aluminum tri sec-butoxide (manufactured by Wako Pure Chemical Industries, Ltd.) followed by addition of 2.07 g of the coating liquid 1, the coating liquid 11 was prepared.

Film forming was carried out in the same manner as Comparative Example 1-1 except that the coating liquid 11 which has been prepared above is used instead of the coating liquid 1. As a result, a gas barrier film was manufactured.

Example 1-5

By adding 16.6 ml of dibutyl ether to 0.287 g of gallium isopropoxide (manufactured by Wako Pure Chemical Industries, Ltd.) followed by addition of 2.41 g of the coating liquid 1, the coating liquid 12 was prepared.

Film forming was carried out in the same manner as Comparative Example 1-1 except that the coating liquid 12 which has been prepared above is used instead of the coating liquid 1. As a result, a gas barrier film was manufactured.

Example 1-6

By adding 16.8 ml of dibutyl ether to 0.318 g of indium isopropoxide (manufactured by Wako Pure Chemical Industries, Ltd.) followed by addition of 2.26 g of the coating liquid 1, the coating liquid 13 was prepared.

Film forming was carried out in the same manner as Comparative Example 1-1 except that the coating liquid 13 which has been prepared above is used instead of the coating liquid 1. As a result, a gas barrier film was manufactured.

Example 1-7

By adding 15.9 ml of dibutyl ether to 0.166 g of magnesium ethoxide (manufactured by Wako Pure Chemical Industries, Ltd.) followed by addition of 3.02 g of the coating liquid 1, the coating liquid 14 was prepared.

Film forming was carried out in the same manner as Comparative Example 1-1 except that the coating liquid 14 which has been prepared above is used instead of the coating liquid 1. As a result, a gas barrier film was manufactured.

Example 1-8

By adding 16.2 ml of dibutyl ether to 0.213 g of calcium isopropoxide (manufactured by SIGMA-ALDRICH) followed by addition of 2.79 g of the coating liquid 1, the coating liquid 15 was prepared.

Film forming was carried out in the same manner as Comparative Example 1-1 except that the coating liquid 15 which has been prepared above is used instead of the coating liquid 1. As a result, a gas barrier film was manufactured.

Example 1-9

By adding 16.3 ml of dibutyl ether to 0.240 g of triisopropyl borate (manufactured by Wako Pure Chemical Industries, Ltd.) followed by addition of 2.65 g of the coating liquid 1, the coating liquid 16 was prepared.

Film forming was carried out in the same manner as Comparative Example 1-1 except that the coating liquid 16 which has been prepared above is used instead of the coating liquid 1. As a result, a gas barrier film was manufactured.

Example 1-10

By adding 17.3 ml of dibutyl ether to 0.418 g of aluminum sec-butoxide followed by addition of 1.76 g of the coating liquid 1 and stirring for 1 hour at 60° C., the coating liquid 17 was prepared.

Film forming was carried out by using the coating liquid 17 which has been prepared above instead of the coating liquid 1 and subsequently heating for 72 hours 100° C. As a result, a gas barrier film was manufactured.

(XPS Analysis)

The obtained gas barrier film was subjected to XPS analysis to measure the composition of a gas barrier layer. Conditions for the XPS analysis are described below.

Apparatus: QUANTERASXM (manufactured by ULVAC-PHI, Inc.)

X ray source: Monochromatized Al-Kα

Measurement range: Si2p, C1s, N1s, O1s

Sputter ion: Ar (2 keV)

Depth profile: Measurement is repeated after sputtering for 1 minute

Depth processing: MultiPak (manufactured by ULVAC-PHI, Inc.)

Quantification: Background is obtained by Shirley method, and quantification is made from an obtained peak area using relative sensitivity coefficient method.

With regard to the length in thickness direction of a region for XPS analysis, the following calibration was performed. Specifically, according to XPS analysis, composition and length in thickness direction are first obtained based on etching rate converted in terms of $SiO_2$. Meanwhile, TEM analysis is also performed for the same sample, and based on cross-sectional image, thickness of the gas barrier layer is obtained. Further, while comparing the TEM cross-sectional image with the composition distribution in thickness direction of a gas barrier layer, which is obtained from the XPS analysis, the composition distribution in thickness direction was characterized. x, y, and z were calculated as an average value in thickness direction of a silicon-containing film.

<<Evaluation 1: Evaluation of Water Vapor Barrier Property>>

(Apparatus for Producing Sample for Evaluation of Water Vapor Barrier Property)

Deposition apparatus: Vacuum deposition apparatus JEE-400 manufactured by JEOL, Ltd.

Constant temperature and humidity oven: Yamato Humidic Chamber IG 47 M.

(Raw Material)

Metal to be corroded by reaction with moisture: calcium (particle)

Water vapor impermeable metal: aluminum (φ: 3 to 5 mm, particle)

(Preparation of Sample for Evaluating Water Vapor Barrier Property)

On a surface of a silicon-containing film (barrier film) of the gas barrier film which has been produced above, metal calcium was vapor-deposited to have a size of 12 mm×12 mm via a mask by using a vacuum deposition apparatus (vacuum vapor deposition apparatus JEE-400 made by JEOL, Ltd.).

Thereafter, the mask was removed while keeping the vacuum condition, and aluminum was deposited on a whole one surface of the sheet to have temporary sealing. Subsequently, the vacuum condition was removed. After immediate transfer to a dry nitrogen gas atmosphere, a quartz glass having a thickness of 0.2 mm was adhered onto the aluminum vapor-deposited surface using an ultraviolet curing resin for sealing (manufactured by Nagase ChemteX Co., Ltd.), and ultraviolet ray were irradiated for adhesion and curing of the resin to have main sealing. As a result, a sample for evaluating water vapor barrier property was prepared.

The obtained sample (cell for evaluation) was stored under high temperature and high moisture condition of 60° C. and 90% RH and, based on the method described in JP 2005-283561 A, the amount of moisture which permeates into the cell was calculated from the corrosion amount of the metal calcium. The evaluation of water vapor barrier property was performed according to the following criteria.

5: Water vapor transmission rate is less than $5\times10^{-5}$ g/(m²·day)

4: Water vapor transmission rate is $5\times10^{-5}$ g/(m²·day) or more and less than $5\times10^{-4}$ g/(m²·day)

3: Water vapor transmission rate is $5\times10^{-4}$ g/(m²·day) or more and less than $5\times10^{-3}$ g/(m²·day)

2: Water vapor transmission rate is $5\times10^{-3}$ g/(m²·day) or more and less than $5\times10^{-2}$ g/(m²·day)

1: Water vapor transmission rate is $5\times10^{-2}$ g/(m²·day) or more and less than $5\times10^{-1}$ g/(m²·day).

<<Evaluation 2: Evaluation of Wet Heat Resistance>>

The manufactured gas barrier film was stored for 100 hours under high temperature and high moisture condition of 85° C. and 85% RH. Accordingly, a sample for evaluating water vapor barrier property was prepared and the water vapor barrier property was evaluated. To have wet heat resistance, (water vapor transmission rate after exposure to high temperature and high moisture)/(water vapor transmission rate before exposure to high temperature and high moisture) was calculated and the result was used as wet heat resistance. As the numerical value obtained by this formula is close to 1, it indicates better wet heat resistance.

<<Evaluation 3: Evaluation of Etching by Hydrogen Fluoride Acid>>

A silicon-containing film (barrier layer) was prepared in the same manner as Comparative Examples 1-1 to 1-4 and Examples 1-1 to 1-8 described above while changing the substrate to a silicon wafer. A sample immersed in 0.125% by weight of hydrogen fluoride acid for 0 minute, 1 minute, 2 minutes, or 3 minutes was prepared, and the film thickness was measured by an ellipsometer. Based on the film thickness etched for 3 minutes, the etching rate was obtained. With regard to a sample which shows complete etching of a film within three minutes, the etching film thickness after 3 minutes was obtained based on the etching rate at just 1 minute before the etching, and the etching rate was calculated.

The results of the evaluation are shown in Table 1.

<Preparation of Substrate 2>
(Preparation of Resin Substrate)

A biaxially stretched polyethylene naphthalate film (PEN film, thickness: 100 μm, width: 350 mm, manufactured by Teijin DuPont Films Japan Limited, product name of "Teonex (registered trademark) Q65FA") was used as a resin substrate.

(Forming of Anchor Coat Layer)

On an easy adhesion layer of the resin substrate described above, a UV curable type organic/inorganic hybrid hard coating material OPSTAR (registered trademark) 27501, which is produced by JSR Corporation, was coated by using a wire bar to have a film thickness of 4 μm after drying, followed by drying under the drying conditions of 80° C. for 3 minutes, and curing was subsequently conducted under the curing conditions including irradiation energy amount of 1.0 J/cm², air atmosphere, and use of a high pressure mercury lamp to form an anchor coat layer.

[Forming of Barrier Layer: Roller CVD Method]

By using a plasma CVD apparatus which has discharge between rollers applied with magnetic field as shown in FIG. 1 (hereinbelow, this method is referred to as a roller CVD method), a resin substrate is set on the apparatus such that the surface opposite to a surface of the resin substrate on which an anchor coat layer is formed is brought into contact with a film forming roller, and a barrier layer is formed on top of the anchor coat layer under the conditions to have thickness of 300 nm according to the following film forming conditions (plasma CVD conditions).

<Conditions for Plasma CVD>

Supply amount of raw material gas (hexamethyldisiloxane, HMDSO): 50 sccm (Standard Cubic Centimeter per Minute)

Supply amount of oxygen gas (O₂): 500 sccm

Vacuum level within vacuum chamber: 3 Pa

Application power from power source for generating plasma: 0.8 kW

Frequency of power source for generating plasma: 70 kHz

Resin substrate conveyance speed: 2 m/min.

TABLE 1

| | Film thickness of silicon-containing film | Metal type | a | x | y | z | Y/(X + Y) | 3Y + 2X | Etching rate (nm/min) | WVTR (g/m²/day) | Wet heat resistance |
|---|---|---|---|---|---|---|---|---|---|---|---|
| Comparative Example 1-1 | 200 nm | None | — | 0.61 | 0.59 | 0 | 0.49 | 2.99 | 47 | 4 | 160 |
| Comparative Example 1-2 | 200 nm | Al | 3 | 1.2 | 0.41 | 0.005 | 0.25 | 3.62 | 41 | 4 | 75 |
| Comparative Example 1-3 | 200 nm | Al | 3 | 2.75 | 0.001 | 0.5 | 0.0004 | 4.00 | 46 | 2 | 1.3 |
| Comparative Example 1-4 | 200 nm | Al | 3 | 1.21 | 0.45 | 0.15 | 0.27 | 3.39 | 44 | 3 | 58 |
| Comparative Example 1-5 | 200 nm | B | 4 | 2.28 | 0.33 | 0.2 | 0.13 | 4.83 | 58 | 1 | 18 |
| Comparative Example 1-6 | 200 nm | B | 3 | 1.35 | 0.29 | 0.2 | 0.18 | 3.10 | 52 | 2 | 25 |
| Comparative Example 1-7 | 200 nm | Rh | 3 | 0.51 | 0.61 | 0.00001 | 0.54 | 2.85 | 48 | 4 | 183 |
| Example 1-1 | 200 nm | Al | 3 | 1.45 | 0.31 | 0.02 | 0.18 | 3.77 | 23 | 4 | 1.4 |
| Example 1-2 | 200 nm | Al | 3 | 2.05 | 0.11 | 0.1 | 0.051 | 4.12 | 11 | 5 | 0.93 |
| Example 1-3 | 200 nm | Al | 3 | 2.29 | 0.08 | 0.15 | 0.034 | 4.33 | 9 | 5 | 0.95 |
| Example 1-4 | 200 nm | Al | 3 | 2.23 | 0.05 | 0.3 | 0.022 | 3.76 | 15 | 4 | 0.99 |
| Example 1-5 | 200 nm | Ga | 3 | 1.72 | 0.33 | 0.1 | 0.16 | 4.12 | 18 | 4 | 1.4 |
| Example 1-6 | 200 nm | In | 3 | 1.63 | 0.22 | 0.1 | 0.12 | 3.65 | 16 | 4 | 1.2 |
| Example 1-7 | 200 nm | Mg | 2 | 1.77 | 0.19 | 0.1 | 0.10 | 3.91 | 13 | 4 | 1.1 |
| Example 1-8 | 200 nm | Ca | 2 | 1.85 | 0.22 | 0.1 | 0.11 | 4.15 | 14 | 4 | 1.2 |
| Example 1-9 | 200 nm | B | 3 | 1.93 | 0.21 | 0.1 | 0.10 | 4.18 | 13 | 4 | 1.1 |
| Example 1-10 | 200 nm | Al | 4 | 1.4 | 0.31 | 0.15 | 0.18 | 3.35 | 25 | 3 | 1.8 |

As it is clearly shown in Table 1, it was found that the gas barrier film of the present invention has an excellent water vapor barrier property and excellent wet heat resistance.

<Measurement of Atom Distribution Profile>

XPS depth profile was measured for the formed barrier layer according to the following conditions. Then, with regard to the distance in film thickness direction from a surface of a thin film layer, silicon atom distribution, oxygen atom distribution, carbon atom distribution, and oxygen and carbon atom distribution were obtained.

Ion species for etching: Argon ($Ar^+$)

Etching speed (values converted in terms of thermally oxidized $SiO_2$ film): 0.05 nm/sec Etching space (values converted in terms of $SiO_2$): 10 nm X ray photoelectron spectroscopy apparatus: type "VG Theta Probe" manufactured by Thermo Fisher Scientific X ray for irradiation: Single crystal spectrophotometric AlKα

Spot and size of X ray: oval with a size of 800×400 μm.

From the silicon atom distribution, oxygen atom distribution, carbon atom distribution, and oxygen and carbon distribution in the whole barrier layer region as measured above, presence or absence of a region showing continuous change in film composition, presence or absence of extreme values, a difference between the maximum value and minimum value of carbon atom ratio, and average atomic ratio of silicon atom, oxygen atom, and carbon atom in at least 90% of the whole film thickness were obtained.

As a result, it was confirmed that there is a region showing continuous change in film composition, extreme values are present, and the average atomic ratio of silicon atom, oxygen atom, and carbon atom satisfies the relationship of (average carbon atomic ratio)<(average silicon atomic ratio)<(average oxygen atomic ratio) in at least 90% of the whole film thickness.

Comparative Example 2-1

The coating liquid 18 was prepared as follows: a dibutyl ether solution containing 20% by weight of perhydropolysilazane (AQUAMICA (registered trademark) NN120-20: produced by AZ electronic materials Co., Ltd.) and a dibutyl ether solution containing 1% by weight of an amine catalyst (N,N,N',N'-tetramethyl-1,6-diaminohexane) and 19% by weight perhydropolysilazane (AQUAMICA (registered trademark) NAX120-20: produced by AZ electronic materials Co., Ltd.) were mixed at a ratio of 4:1.

The coating liquid 13 prepared from above was diluted with dibutyl ether, and it was coated on the substrate 2 by using a spin coater such that the film thickness after drying is 200 nm. By drying it for 2 minutes at 100° C., a coating film was obtained. The obtained coating film was irradiated with vacuum ultraviolet ray (MODEL: MECL-M-1-200, excimer illuminator manufactured by M. D. COM. Inc., wavelength of 172 nm, stage temperature of 100° C., integrated light amount of 3 $J/cm^2$, and oxygen concentration of 0.1%) to produce a gas barrier film.

Comparative Example 2-2

By adding 15.1 ml of dibutyl ether to 0.025 g of ALCH (aluminum ethylacetoacetate.diisopropylate manufactured by Kawaken Fine Chemicals Co., Ltd.) followed by addition of 3.73 g of the coating liquid 18, the coating liquid 19 was prepared.

Film forming was carried out in the same manner as Comparative Example 2-1 except that the coating liquid 19 which has been prepared above is used instead of the coating liquid 18. As a result, a gas barrier film was manufactured.

Comparative Example 2-3

By adding 18.3 ml of dibutyl ether to 0.591 g of ALCH (aluminum ethylacetoacetate.diisopropylate manufactured by Kawaken Fine Chemicals Co., Ltd.) followed by addition of 0.89 g of the coating liquid 18, the coating liquid 20 was prepared.

Film forming was carried out in the same manner as Comparative Example 2-1 except that the coating liquid 20 which has been prepared above is used instead of the coating liquid 18. As a result, a gas barrier film was manufactured.

Comparative Example 2-4

By adding 16.7 ml of dibutyl ether to 0.306 g of ALCH (aluminum ethylacetoacetate.diisopropylate manufactured by Kawaken Fine Chemicals Co., Ltd.) followed by addition of 2.32 g of the coating liquid 18, the coating liquid 21 was prepared.

Film forming was carried out in the same manner as Comparative Example 2-1 except that the coating liquid 16 which has been prepared above is used instead of the coating liquid 18 and the integrated light amount is changed to 1 $J/cm^2$. As a result, a gas barrier film was manufactured.

Example 2-1

By adding 16.1 ml of dibutyl ether to 0.191 g of ALCH (aluminum ethylacetoacetate.diisopropylate manufactured by Kawaken Fine Chemicals Co., Ltd.) followed by addition of 2.89 g of the coating liquid 18, the coating liquid 22 was prepared.

Film forming was carried out in the same manner as Comparative Example 2-1 except that the coating liquid 22 which has been prepared above is used instead of the coating liquid 18. As a result, a gas barrier film was manufactured.

Example 2-2

By adding 16.7 ml of dibutyl ether to 0.306 g of ALCH (aluminum ethylacetoacetate.diisopropylate manufactured by Kawaken Fine Chemicals Co., Ltd.) followed by addition of 2.32 g of the coating liquid 18, the coating liquid 23 was prepared.

Film forming was carried out in the same manner as Comparative Example 2-1 except that the coating liquid 23 which has been prepared above is used instead of the coating liquid 18. As a result, a gas barrier film was manufactured.

Example 2-3

By adding 17.4 ml of dibutyl ether to 0.438 g of ALCH (aluminum ethylacetoacetate.diisopropylate manufactured by Kawaken Fine Chemicals Co., Ltd.) followed by addition of 1.66 g of the coating liquid 18, the coating liquid 24 was prepared.

Film forming was carried out in the same manner as Comparative Example 2-1 except that the coating liquid 24 which has been prepared above is used instead of the coating liquid 18. As a result, a gas barrier film was manufactured.

Example 2-4

By adding 19.9 ml of dibutyl ether to 0.01 g of ALCH (aluminum ethylacetoacetate.diisopropylate manufactured by Kawaken Fine Chemicals Co., Ltd.) followed by addition of 0.08 g of the coating liquid 18, the coating liquid 25 was prepared.

Film forming was carried out in the same manner as Comparative Example 2-1 except that the coating liquid 25 which has been prepared above is used instead of the coating liquid 18. As a result, a gas barrier film was manufactured.

Example 2-5

By adding 19.1 ml of dibutyl ether to 0.08 g of ALCH (aluminum ethylacetoacetate.diisopropylate manufactured by Kawaken Fine Chemicals Co., Ltd.) followed by addition of 0.62 g of the coating liquid 18, the coating liquid 26 was prepared.

Film forming was carried out in the same manner as Comparative Example 2-1 except that the coating liquid 26 which has been prepared above is used instead of the coating liquid 18. As a result, a gas barrier film was manufactured.

Example 2-6

By adding 13.4 ml of dibutyl ether to 0.613 g of ALCH (aluminum ethylacetoacetate.diisopropylate manufactured by Kawaken Fine Chemicals Co., Ltd.) followed by addition of 4.64 g of the coating liquid 18, the coating liquid 27 was prepared.

Film forming was carried out in the same manner as Comparative Example 2-1 except that the coating liquid 27 which has been prepared above is used instead of the coating liquid 18. As a result, a gas barrier film was manufactured.

Example 2-7

By adding 6.77 ml of dibutyl ether to 1.22 g of ALCH (aluminum ethylacetoacetate.diisopropylate manufactured by Kawaken Fine Chemicals Co., Ltd.) followed by addition of 9.27 g of the coating liquid 18, the coating liquid 28 was prepared.

Film forming was carried out in the same manner as Comparative Example 2-1 except that the coating liquid 28 which has been prepared above is used instead of the coating liquid 18. As a result, a gas barrier film was manufactured.

Example 2-8

By adding 12.4 ml of dibutyl ether to 0.487 g of ALCH (aluminum ethylacetoacetate.diisopropylate manufactured by Kawaken Fine Chemicals Co., Ltd.) and 0.304 g of titanium tetraisopropoxide followed by addition of 4.93 g of the coating liquid 18, the coating liquid 29 was prepared.

Film forming was carried out in the same manner as Comparative Example 2-1 except that the coating liquid 29 which has been prepared above is used instead of the coating liquid 18. As a result, a gas barrier film was manufactured.

<Production of Organic EL Element>

By using the gas barrier film which has been produced in Comparative Examples 2-1 to 2-4 and Examples 2-1 to 2-8, an organic EL element was produced according to the following method.

Forming of First Electrode Layer

On the gas barrier layer of the gas barrier film which has been prepared in Example 1, ITO (indium tin oxide) film with thickness of 150 nm was formed by a sputtering method, and by performing patterning by photolithography, a first electrode layer was formed. Meanwhile, the pattern was formed to be a pattern having a light emitting area of 50 mm$^2$.

Forming of Hole Transport Layer

A solution obtained by diluting polyethylene dioxythiophene.polystyrene sulfonate (PEDOT/PSS: Baytron (registered trademark) P AI 4083 manufactured by Bayer) with 65% pure water and 5% methanol was prepared as a coating liquid for forming a hole transport layer.

The surface opposite to a surface of a gas barrier film on which the first electrode film has been formed was subjected to a treatment for modifying a cleaned surface. For the treatment for modifying a cleaned surface, a low pressure mercury lamp (wavelength of 184.9 nm and irradiation intensity of 15 mW/cm$^2$) was used and the treatment was performed at conditions to have a distance of 10 mm from the gas barrier film. The antistatic treatment was performed by using a neutralizer having weak X ray.

On top of the first electrode layer which has been formed as described above, the coating liquid for forming a hole transport layer prepared above was coated by using an extrusion applicator to have thickness of 50 nm after drying under the conditions including air atmosphere, 25° C., and relative humidity of (RH) 50%. Then, the solvent was removed from the obtained coating film at temperature of 100° C. with air from height of 100 mm, discharge air speed of 1 m/s, and width air speed distribution of 5% toward the formed film surface. Subsequently, by using an apparatus for heating treatment, a heating treatment based on backside electric heating mode was performed at 150° C. to form a hole transport layer.

Forming of Light Emitting Layer 1.0 g of H-A as a host material, 100 mg of D-A as a dopant material, 0.2 mg of D-B as a dopant material, and 0.2 mg of D-C as a dopant material were dissolved in 100 g toluene to prepare a coating liquid for forming a white light emitting layer.

[Chem. 7]

H-A

D-A

D-B

D-C

The coating of the coating liquid for forming a white light emitting layer, which has been prepared above, on top of the hole transport layer which has been formed above was performed by using an extrusion applicator to have thickness of 40 nm after drying under an environment with nitrogen gas concentration of 99% or more, coating temperature of 25° C. and coating speed of 1 m/min. Then, the solvent was removed from the obtained coating film at temperature of 60° C. with air from height of 100 mm, discharge air speed of 1 m/s, and width air speed distribution of 5% toward the formed film surface. Subsequently, by using an apparatus for heating treatment, a heating treatment based on backside electric heating mode was performed at 130° C. to form a light emitting layer.

Forming of Electron Transport Layer

The following E-A was dissolved in 2,2,3,3-tetrafluoro-1-propanol to obtain a 0.5% by weight solution, which was then used as a coating liquid for forming an electron transport layer.

[Chem. 8]

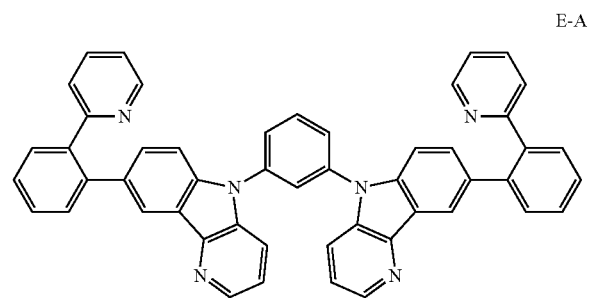

E-A

The coating of the coating liquid for forming an electron transport layer on top of the light emitting layer which has been formed above was performed by using an extrusion applicator to have thickness of 30 nm after drying under an environment with nitrogen gas concentration of 99% or more, coating temperature of 25° C. and coating speed of 1 m/min. Then, the solvent was removed from the obtained coating film at temperature of 60° C. with air from height of 100 mm, discharge air speed of 1 m/s, and width air speed distribution of 5% toward the formed film surface. Subsequently, by using an apparatus for heating treatment, a heating treatment based on backside electric heating mode was performed at 200° C. to form an electron transport layer.

Forming of Electron Injection Layer

Subsequently, an electron injection layer was formed on the top of the electron transport layer which has been formed as described above. More specifically, a gas barrier film having a first electrode layer, a hole transport layer, a light emitting layer, and an electron transport layer was added into a chamber under reduced pressure, and the pressure was lowered to $5 \times 10^{-4}$ Pa. By heating cesium fluoride which has been prepared in advance in a tantalum deposition boat within a vacuum chamber, an electron injection layer having a thickness of 3 nm was formed.

Forming of Second Electrode

A second electrode was formed on top of the electron injection layer which has been formed above, excluding a region to be an extraction electrode on the first electrode. More specifically, a gas barrier film having a first electrode layer, a hole transport layer, a light emitting layer, an electron transport layer, and an electron injection layer was added to a reduced-pressure chamber and the pressure was lowered to $5 \times 10^{-4}$ Pa. As a material for forming the second electrode, aluminum was used, and the second electrode was formed by mask pattern film forming based on vapor phase method so as to have an extraction electrode and a light emitting area of 50 mm×50 mm. Meanwhile, the second electrode has a thickness of 100 nm.

Cutting

The gas barrier film formed up to the second electrode was transferred again to a nitrogen atmosphere, and cut to a predetermined size by using ultraviolet laser.

Attachment of Electrode Lead

To the gas barrier film which has been cut as described above, a flexible print substrate (base film: polyimide 12.5 μm, pressed copper foil 18 μm, cover layer: polyimide 12.5 μm, surface treatment: NiAu plating) was attached by using an anisotropic conductive film DP3232S9 (manufactured by Sony Chemical and Information Device Corporation). At that time, compression was performed for 10 seconds at temperature of 170° C. (ACF temperature of 140° C. measured by using a separate thermocouple) and pressure of 2 MPa to achieve the attachment.

Sealing

The organic EL element 1 was manufactured by adhesion of a sealing member on a gas barrier film attached with an electrode lead (flexible print substrate) by using a commercially available roll laminator. More specifically, as a sealing member, a 30 μm thick aluminum foil (manufactured by TOYO ALUMINIUM K.K.) laminated with a polyethylene terephthalate (PET) film (12 μm thick) by using adhesive for dry lamination (two-liquid reaction type urethane-based adhesive) was used (thickness of adhesive layer: 1.5 μm). As an adhesive for adhesion of the sealing member, a thermosetting adhesive containing bisphenol A diglycidyl ether (DGEBA) as an epoxy-based curing adhesive, dicyandiamide (DICY), and an epoxy adduct-based curing promoter was used. A thermosetting adhesive was uniformly coated on an aluminum surface of the prepared sealing member to have a thickness of 20 μm along the surface attached with an aluminum foil (glossy surface) by using a dispenser. After that, the sealing member was closely attached and placed such that the connection part between the extraction electrode and the electrode lead is covered. Then, it was tightly sealed by using a compression roll with compression condition including compression roll temperature of 120° C., pressure of 0.5 MPa, and apparatus speed of 0.3 m/min.

<Evaluation of Dark Spots (DS) Before Wet Heat>

The area of spots which do not exhibit light emission (dark spots, DS) in a region supposed to have light emission at the time of inducing light emission by application of voltage to the organic EL element produced above was measured. It was then evaluated according to the following criteria.

⊚: Area of DS in a region supposed to have light emission is less than 0.05%

○: Area of DS in a region supposed to have light emission is 0.05% or more and less than 1%

Δ: Area of DS in a region supposed to have light emission is 1% or more and less than 5%

X: Area of DS in a region supposed to have light emission is 5% or more.

<Evaluation of Dark Spots (DS) after Wet Heat>

An organic EL element was produced in the same manner as above except that a gas barrier film of Comparative Examples 2-1 to 2-4 and Examples 2-1 to 2-8, which has been exposed to 85° C., 85% RH for 100 hours, is used. Evaluation of dark spots (DS) was performed in the same manner as above.

Evaluations results are shown in the following Table 2.

TABLE 2

| | Film thickness of silicon-containing film | Metal type | a | x | y | z | Y/(X + Y) | 3Y + 2X | Etching rate (nm/min) | DS before wet heat | DS after wet heat |
|---|---|---|---|---|---|---|---|---|---|---|---|
| Comparative Example 2-1 | 150 nm | None | — | 0.61 | 0.59 | 0 | 0.49 | 2.99 | 47 | ○ | X |
| Comparative Example 2-2 | 150 nm | Al | 3 | 1.2 | 0.42 | 0.005 | 0.26 | 3.65 | 41 | ○ | X |
| Comparative Example 2-3 | 150 nm | Al | 3 | 2.73 | 0.0009 | 0.5 | 0.00033 | 3.97 | 43 | ○ | X |
| Comparative Example 2-4 | 150 nm | Al | 3 | 1.15 | 0.51 | 0.1 | 0.31 | 3.56 | 45 | Δ | X |
| Example 2-1 | 150 nm | Al | 3 | 1.58 | 0.24 | 0.05 | 0.13 | 3.74 | 18 | ○ | Δ |
| Example 2-2 | 150 nm | Al | 3 | 2.06 | 0.1 | 0.1 | 0.05 | 4.11 | 10 | ⊙ | ⊙ |
| Example 2-3 | 150 nm | Al | 3 | 2.12 | 0.08 | 0.2 | 0.04 | 3.90 | 9 | ⊙ | ⊙ |
| Example 2-4 | 5 nm | Al | 3 | 2.12 | 0.09 | 0.1 | 0.04 | 4.20 | 11 | Δ | Δ |
| Example 2-5 | 40 nm | Al | 3 | 2.06 | 0.1 | 0.1 | 0.05 | 4.11 | 10 | ○ | ○ |
| Example 2-6 | 300 nm | Al | 3 | 2.05 | 0.11 | 0.1 | 0.05 | 4.12 | 13 | ⊙ | ⊙ |
| Example 2-7 | 600 nm | Al | 3 | 2.08 | 0.11 | 0.1 | 0.05 | 4.18 | 15 | ○ | ○ |
| Example 2-8 | 100 nm | Al:Ti = 7:3 | 3.3 | 2.06 | 0.1 | 0.1 | 0.05 | 4.08 | 14 | ○ | ○ |

As clearly shown in the results described in Table 2, it was found that the organic EL element in which the gas barrier film of the present invention is used has excellent wet heat resistance.

Meanwhile, the present application is based on Japanese Patent Application No. 2013-003640 filed on Jan. 11, 2013 and Japanese Patent Application No. 2013-026892 filed on Feb. 14, 2013, and their disclosures are incorporated herein by reference in their entirety.

The invention claimed is:

1. A gas barrier film comprising:
   a substrate; and
   a silicon-containing film that has a chemical composition represented by the following Chemical Formula (1) and that satisfies the relationships represented by Mathematical Formula 1 and Mathematical Formula 2:

[Chemical Formula (1)]

$$SiO_xN_yM_z \quad (1)$$

$$0.001 \leq Y/(X+Y) \leq 0.25 \quad \text{[Mathematical Formula 1]}$$

$$3.30 \leq 3Y+2X \leq 4.80 \quad \text{[Mathematical Formula 2]}$$

in Chemical Formula (1), M represents at least one selected from a group consisting of the elements belonging to Group 2 to Group 14 in the long period type Periodic Table (with the proviso that, silicon and carbon are excluded), x represents an atomic ratio of oxygen relative to silicon, y represents an atomic ratio of nitrogen relative to silicon, and z represents an atomic ratio of M relative to silicon, which is 0.01 to 0.3, and
   in Mathematical Formula 1 and Mathematical Formula 2, $X=x/(1+(az/4))$, and $Y=y/(1+(az/4))$ (with the proviso that, a is the valency of the element M).

2. The gas barrier film according to claim 1, wherein M in Chemical Formula (1) is at least one selected from a group consisting of boron (B), magnesium (Mg), aluminum (Al), calcium (Ca), titanium (Ti), chromium (Cr), manganese (Mn), iron (Fe), cobalt (Co), copper (Cu), zinc (Zn), gallium (Ga), zirconium (Zr), silver (Ag), and indium (In).

3. The gas barrier film according to claim 1, wherein the silicon-containing film is formed by a modification treatment based on active energy ray irradiation of a layer containing polysilazane and at least one selected from a group consisting of compounds which contain an element belonging to Group 2 to Group 14 in the long period type Periodic Table (with the proviso that, silicon and carbon are excluded).

4. An electronic device having a gas barrier film according to claim 1.

* * * * *